United States Patent
Xu et al.

(10) Patent No.: US 10,148,253 B2
(45) Date of Patent: Dec. 4, 2018

(54) CIRCUITS FOR SWITCHED CAPACITOR RECEIVER FRONT-ENDS

(71) Applicants: Yang Xu, New York, NY (US); Peter R. Kinget, Summit, NJ (US)

(72) Inventors: Yang Xu, New York, NY (US); Peter R. Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 15/573,385

(22) PCT Filed: May 11, 2016

(86) PCT No.: PCT/US2016/031921
§ 371 (c)(1),
(2) Date: Nov. 10, 2017

(87) PCT Pub. No.: WO2016/183235
PCT Pub. Date: Nov. 17, 2016

(65) Prior Publication Data
US 2018/0138897 A1    May 17, 2018

Related U.S. Application Data

(60) Provisional application No. 62/233,176, filed on Sep. 25, 2015, provisional application No. 62/159,872, filed on May 11, 2015.

(51) Int. Cl.
*H03J 3/08* (2006.01)
*H03J 5/24* (2006.01)

(52) U.S. Cl.
CPC . *H03J 3/08* (2013.01); *H03J 5/24* (2013.01)

(58) Field of Classification Search
CPC ...................................... H03J 3/08; H03J 5/24
(Continued)

(56) References Cited

U.S. PATENT DOCUMENTS

| 4,458,237 A | * | 7/1984 | Domogalla | ......... H03M 1/1071 341/118 |
| 5,729,230 A | | 3/1998 | Jensen et al. | |

(Continued)

OTHER PUBLICATIONS

Andrews, C. and Molnar, A., "A Passive Mixer-First Receiver With Digitally Controlled and Widely Tunable RF Interface", In IEEE Journal of Solid-State Circuits, vol. 45, No. 12, Dec. 2010, pp. 2696-2708.

(Continued)

*Primary Examiner* — Tan H Trinh
(74) *Attorney, Agent, or Firm* — Byrne Poh LLP

(57) ABSTRACT

Switched capacitor radio frequency receiver front-ends are provided, comprising: a plurality of banks, each comprising: a first switch connected to a RF input signal; a sampling capacitor connected to the first switch and to ground; a second switch connected in parallel to the sampling capacitor; and a Gm cell coupled to the sampling capacitor and an output; wherein: the output of the Gm cell of each of the plurality on banks are coupled together; and the first switch and the second switch are controlled by a multi-phase signal that causes, for each of the plurality of banks, the first switch to be turned ON at a first point in time and the second switch to be turned ON at a second point in time, wherein the first point in time for a first bank is not the same as the first point in time for a second bank.

11 Claims, 33 Drawing Sheets

(58) Field of Classification Search
USPC ......... 455/68, 77, 150.1, 151.4, 139, 178.1,
455/234.1; 307/109; 341/110, 172, 174,
341/144, 118; 330/311; 345/174;
324/78, 679
See application file for complete search history.

(56) References Cited

U.S. PATENT DOCUMENTS

| | | | |
|---|---|---|---|
| 6,058,294 A * | 5/2000 | Bruwer | H03B 5/20 307/109 |
| 6,563,363 B1 * | 5/2003 | Tay | H03K 5/2481 327/337 |
| 7,006,583 B2 | 2/2006 | Ho et al. | |
| 7,057,540 B2 | 6/2006 | Muhammad et al. | |
| 7,259,643 B2 | 8/2007 | Son et al. | |
| 7,299,020 B2 | 11/2007 | Shen et al. | |
| 7,447,491 B2 | 11/2008 | Khoini-Poorfard | |
| 7,724,110 B2 | 5/2010 | Abbaspour-Tamijani et al. | |
| 7,792,513 B2 | 9/2010 | Safarian et al. | |
| 8,026,760 B1 * | 9/2011 | Prasad | H03F 3/005 330/311 |
| 8,577,325 B2 | 11/2013 | Lee et al. | |
| 8,614,639 B1 * | 12/2013 | Yin | H03M 1/56 341/144 |
| 9,219,507 B2 | 12/2015 | Rofougaran et al. | |
| 9,407,296 B2 | 8/2016 | Rajapandian et al. | |
| 9,525,447 B1 | 12/2016 | Wu et al. | |
| 2006/0040628 A1 * | 2/2006 | Porret | H03J 5/244 455/234.1 |
| 2008/0129575 A1 * | 6/2008 | Huang | H03M 1/1215 341/172 |
| 2008/0174379 A1 * | 7/2008 | Chen | H03B 5/1228 331/177 V |
| 2009/0066556 A1 * | 3/2009 | Gerber | H03M 1/1023 341/172 |
| 2010/0029323 A1 | 2/2010 | Tasic et al. | |
| 2010/0045495 A1 * | 2/2010 | Sano | G11C 27/026 341/110 |
| 2010/0156575 A1 * | 6/2010 | Shah | H03J 3/08 334/78 |
| 2010/0316172 A1 | 12/2010 | Keehr et al. | |
| 2011/0026507 A1 | 2/2011 | Katsube et al. | |
| 2012/0280700 A1 * | 11/2012 | Yang | G01D 5/24 324/679 |
| 2013/0136211 A1 | 5/2013 | Jussila et al. | |
| 2014/0045444 A1 * | 2/2014 | Furuta | H03M 1/1245 455/230 |
| 2014/0171006 A1 | 6/2014 | Murphy et al. | |
| 2014/0355728 A1 | 12/2014 | Liao et al. | |
| 2015/0003306 A1 * | 1/2015 | Domino | H03H 11/28 370/297 |
| 2015/0162940 A1 | 6/2015 | Mikhemar et al. | |
| 2016/0170519 A1 * | 6/2016 | Dattalo | G01D 5/24 345/174 |
| 2017/0026066 A1 | 1/2017 | Kinget et al. | |
| 2018/0041183 A1 * | 2/2018 | Mavretic | H01J 37/32183 |

OTHER PUBLICATIONS

Borremans, J. et al., "A 0.9V Low-Power 0.4-6GHz Linear SDR Receiver in 28nm CMOS", In Symposium on VLSI Circuits, Kyoto, Japan, Jun. 12-14, 2013, pp. C146-C147.

Borremans, J. et al., "A 40 nm CMOS 0.4-6 GHz Receiver Resilient to Out-of-Band Blockers", In IEEE Journal of Solid-State Circuits, vol. 46, No. 7, Jul. 2011, pp. 1659-1671.

Chen, R. and Hashemi, H., "A 0.5-to-3 GHz Software-Defined Radio Receiver using Discrete-Time RF Signal Processing", In iEEE Journal of Solid-State Circuits, vol. 49, No. 5, May 2014, pp. 1097-1111.

Chen, R. and Hashemi, H., "A 0.5-to-3 GHz Software-Defined Radio Receiver using Sample Domain Signal Processing", In Proceedings of IEEE Radio Frequency Integrated Circuits Symposium (RFIC), Seattle, WA, US, Jun. 2-4, 2013, pp. 315-318.

Choi, I. and Kim, B., "A Passive Mixer-First Receiver Front-End Without External Components for Mobile TV Applications", in IEEE Radio Frequency Integrated Circuits Symposium, Jun. 2013, pp. 145-148.

Darvishi et al., "A 0.3-to-1.2Ghz Tunable 4th-order switched g-C bandpass filter with >55dB ultimate rejection and out-of-band IIP3 of +29dBm", In Proceedings of ISSCC, Feb. 2012, pp. 358-360.

Darvishi, M. et al., "A 0.1-to-1.2GHz Tunable 6th-Order N-Path Channel-Select Filter with 0.6dB Passband Ripple and +7dBm Blocker Tolerance", in Papers IEEE International Solid-State Circuits Conference (ISSCC) Digest of Technical, San Francisco, CA, US, Feb. 2013, pp. 172-173.

Darvishi, M. et al., "Design of Active N-Path Filters", In IEEE Journal of Solid-State Circuits, vol. 48, No. 12, Dec. 2013, pp. 2962-2976.

Ghaffari, A. et al., "8-Path Tunable RF Notch Filters for Blocker Suppression", In IEEE International Solid-State Circuits Conference (ISSCC) Digest of Technical Papers, Feb. 2012, pp. 76-78.

Hedayati, H. et al., "A 1.8 dB NF Blocker-Filtering Noise-Canceling Wideband Receiver with Shared TIA in 40nm CMOS", In IEEE Radio Frequency Integrated Circuits Symposium, Tampa, FL, USA, Jun. 1-3, 2014, pp. 325-328.

International Preliminary Report on Patentability and Written Opinion dated Nov. 14, 2017 in International Patent Application No. PCT/US2016/031921.

International Search Report and Written Opinion dated Aug. 11, 2016 in International Application No. PCT/US2016/031921.

Klumperink, E. and Nauta, B., "Software Defined Radio Receiver Exploiting Noise Cancelling: A Tutorial Review", In IEEE Communications MAgazine, vol. 52, No. 10, Oct. 2014, pp. 111-117.

Mehrpoo, M. and Staszewski, R.B., "A Highly Selective LNTA Capable of Large-Signal Handling for RF Receiver Front-Ends", In IEEE Radio Frequency Integrated Circuits Symposium, Seattle, WA, USA, Jun. 2-4, 2013, pp. 185-188.

Mirzaei, A. et al., "Analysis of First-Order Anti-Aliasing Integration Sampler", In IEEE Transactions on Circuits and Systems I, vol. 55, No. 10, Nov. 2008, pp. 2994-3005.

Murphy, D. et al., "A Blocker-Tolerant, Noise-Cancelling Receiver Suitable for Wideband Wireless Applications", In IEEE Journal of Solid-State Circuits, vol. 47, No. 12, Dec. 2012, pp. 2943-2963.

Notice of Allowance dated May 30, 2017 in U.S. Appl. No. 15/276,308.

Tohidian, M. et al., "Analysis and Design of a High-Order Discrete-Time Passive IIR Low-Pass Filter", In IEEE Journal of Solid-State Circuits, vol. 49, No. 11, Nov. 2014, pp. 2575-2587.

Van Liempd, B. et al., "A 0.9V 0.4-6GHz Harmonic Recombination SDR Receiver in 28nm CMOS with HR3/HR5 and IIP2 Calibration", In IEEE Journal of Solid-State Circuits, vol. 49, No. 8, Aug. 2014, pp. 1815-1826.

Xu, Y. et al., "A Blocker-Tolerant RF Front End with Harmonic-Rejecting N-Path Filtering", In IEEE Radio Frequency Integrated Circuits Symposium, Jun. 2014, pp. 39-42.

Zhang, H. and Sanchez-Sinencio, E., "Linearization Techniques for CMOS Low Noise Amplifiers: A Tutorial", In IEEE Transactions on Circuits Systems, I, Jan. 2011, pp. 22-36.

Zhou, J. et al., "Low-Noise Active Cancellation of Transmitter Leakage and Transmitter Noise in Broadband Wireless Receivers for FDD/Co-Existance", In IEEE Journal of Solid-State Circuits, vo. 49, No. 12, Dec. 2014, pp. 3046-3062.

* cited by examiner

CIRCUITS FOR SWITCHED CAPACITOR RECEIVER FRONT-ENDS

CROSS REFERENCE TO RELATED APPLICATION

This application claims the benefit of U.S. Provisional Patent Application No. 62/159,872, filed May 11, 2015, and U.S. Provisional Patent Application No. 62/233,176, filed Sep. 25, 2015, each of which is hereby incorporated by reference herein in its entirety.

STATEMENT REGARDING GOVERNMENT FUNDED RESEARCH

This invention was made with government support under contract FA8650-11-1-7159 awarded by USAF/ESC. The government has certain rights in the invention.

BACKGROUND

Wideband receiver (RX) front-ends are critical for the implementation of software-defined radio (SDR) and cognitive radio (CR) systems. In those systems, the goal is to replace the high-quality fixed off-chip radio-frequency (RF) filters with tunable RF filtering so that a blocker-tolerant RF receiver front-end can be realized.

Accordingly, new receiver front-ends with tunable RF filtering are desirable.

SUMMARY

Circuits for a switched capacitor radio frequency (RF) receiver front-end are provided, the circuits comprising: a plurality of banks, each comprising: a first switch having a first side connected to a RF input signal and a second side; a sampling capacitor having a first side connected to the second side of the first switch and a second side connected to ground; a second switch having a first side connected to the first side of the sampling capacitor and a second side connected to the second side of the sampling capacitor; and a Gm cell having a first input coupled to the first side of the sampling capacitor and an output; wherein: the output of the Gm cell of each of the plurality on banks are coupled together; and the first switch and the second switch are controlled by a multi-phase signal that causes, for each of the plurality of banks, the first switch to be turned ON at a first point in time and the second switch to be turned ON at a second point in time, wherein the first point in time for a first of the plurality of banks is not the same as the first point in time for a second of the plurality of banks.

DETAILED DESCRIPTION

In accordance with some embodiments, switched capacitor (SC) RF receiver front-ends are provided. In some embodiments, high-order filtering is achieved by linear passive SC circuits to attenuate out-of-band (OB) blockers before they reach the nonlinear active baseband amplifier of the receiver front-end. In some embodiments, the SC RF receiver front-end can also perform RF input impedance matching, N-path filtering, high-order discrete-time infinite-impulse response (IIR) filtering, and down conversion. In some embodiments, the front-end can be implemented in 40 nm CMOS, 65 nm CMOS, and/or any other suitable technology.

Figure 1:
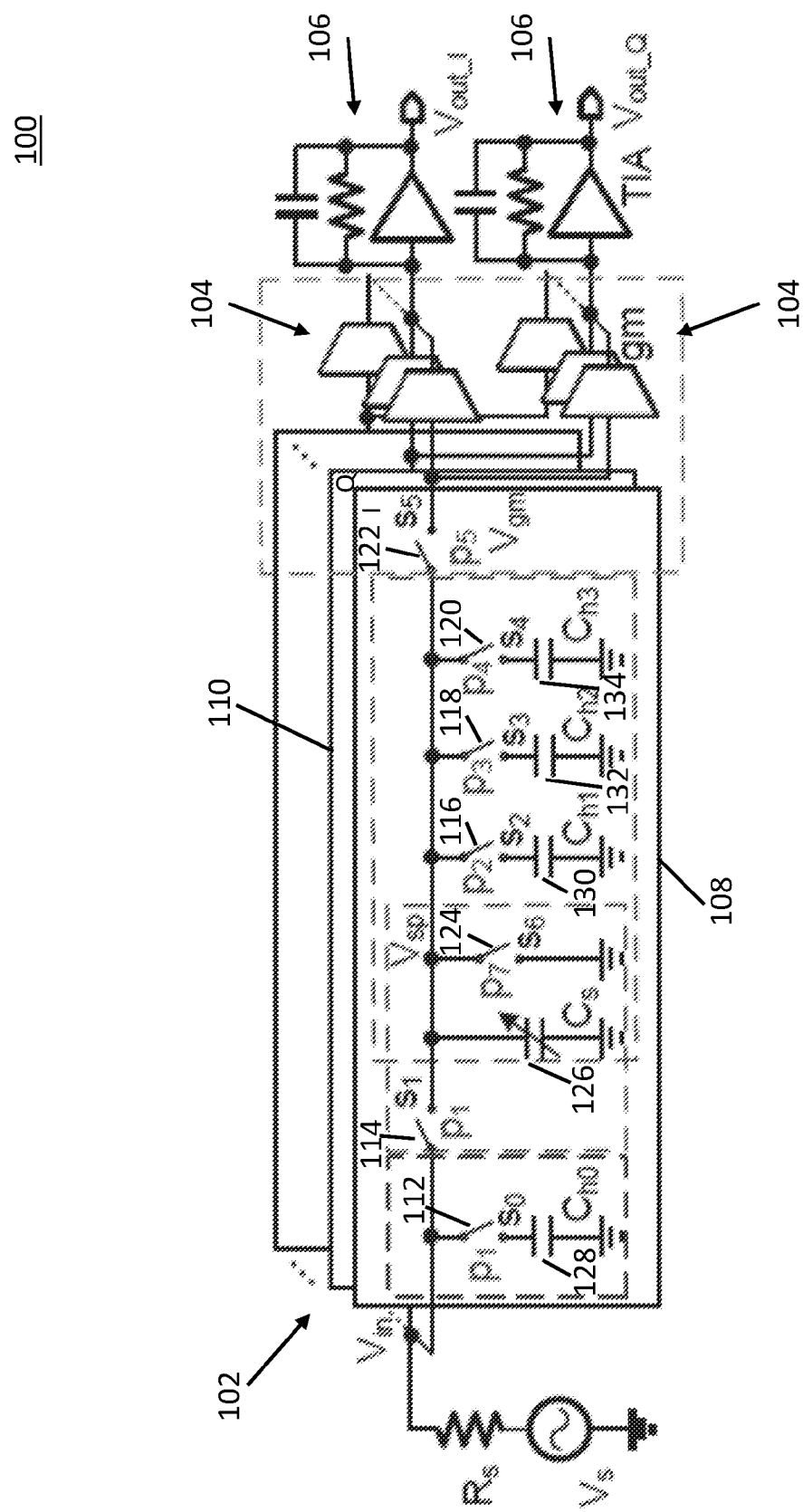
FIG. 1 is a block diagram of an example of an architecture of a single-ended version of a switched capacitor (SC) radio frequency (RF) receiver front-end in accordance with some embodiments.

Turning to FIG. 1, an example 100 of an architecture of a single-ended version of a SC RF receiver front-end in accordance with some embodiments is shown. Architecture 100 includes eight RF SC banks 102 (which each include an in-phase section 108 and a quadrature section 110 each having the same circuitry as illustrated in section 108) followed by baseband Gm cells 104 and trans-impedance amplifiers (TIAs) 106.

Although eight banks 102 are illustrated herein, any suitable number of banks can be used in some embodiments.

As shown in FIG. 1, each of sections 108 and 110 can include switches $s_0$ 112, $s_1$ 114, $s_2$ 116, $s_3$ 118, $s_4$ 120, $s_5$ 122, and $s_6$ 124. These switches can be implemented in any suitable manner. For example, in some embodiments, as described below in connection with FIG. 19, these switches can be implemented using PMOS transistors, NMOS transistors, CMOS transmission gates, etc.

As also shown, each of sections 108 and 110 can include capacitors $C_s$ 126, $C_{h0}$ 128, $C_{h1}$ 130, $C_{h2}$ 132, and $C_{h3}$ 134. These capacitors can be implemented in any suitable manner. For example, in some embodiments, these capacitors can be implements using metal-oxide-metal (MoM) layers.

Figure 28:
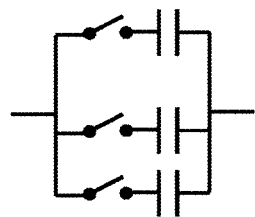
FIG. 28 is a block diagram of an example of a variable capacitor in accordance with some embodiments.

In some embodiments, capacitor $C_s$ 126 can be variable. This can be implemented in any suitable manner. For example, in some embodiments, capacitor $C_s$ 126 can be implemented using a bank of parallel series-switch-capacitor pairs that can enable capacitors to be switched in and out of the bank as shown in FIG. 28. Any suitable number of pairs can be provided in the bank in some embodiments.

In some embodiments, the series-switch-capacitor pair formed by switch $s_0$ 112 and capacitor $C_{h0}$ 128 can be replaced with any suitable number of parallel series-switch-capacitor pairs. In such a scenario, the switches can be controlled by a common signal, or by separate signals.

In accordance with some embodiments, capacitors $C_{h0}\langle i\rangle$ 128 and switches $s_0\langle i\rangle$ 112 in all eight banks (i=1 . . . 8) can be used to form an RF N-path filter (NPF) (where N equals 8 based on the eight banks) to attenuate the OB signals.

In some embodiments, capacitors $C_s\langle i\rangle$ 126 and switches $s_1\langle i\rangle$ 114 and $s_6\langle i\rangle$ 124 can be used to perform impedance matching. Also, the RF signal can be sampled on $C_s\langle i\rangle$, and the continuous-time (CT) signal converted to the discrete-time (DT) domain.

After sampling, history capacitors $C_{h1}\langle i\rangle$ 130, $C_{h2}\langle i\rangle$ 132, and $C_{h3}\langle i\rangle$ 134 and switches $s_2\langle i\rangle$ 116, $s_3\langle i\rangle$ 118, and $s_4\langle i\rangle$ 120, as well as capacitors $C_s\langle i\rangle$ 126 and switches $s_6\langle i\rangle$ 124, realize a high-order DT infinite-impulse-response (IIR) filter, and switches $s_5\langle i\rangle$ 122 propagate the signal to the input nodes of Gm cells 104.

The Gm cells receiving inputs from the in-phase (I) paths 108 and quadrature (Q) paths 110 combine the signal from all eight SC banks and achieve harmonic rejecting down-conversion. Also, here the DT signal is converted back to the CT domain.

Figure 2:
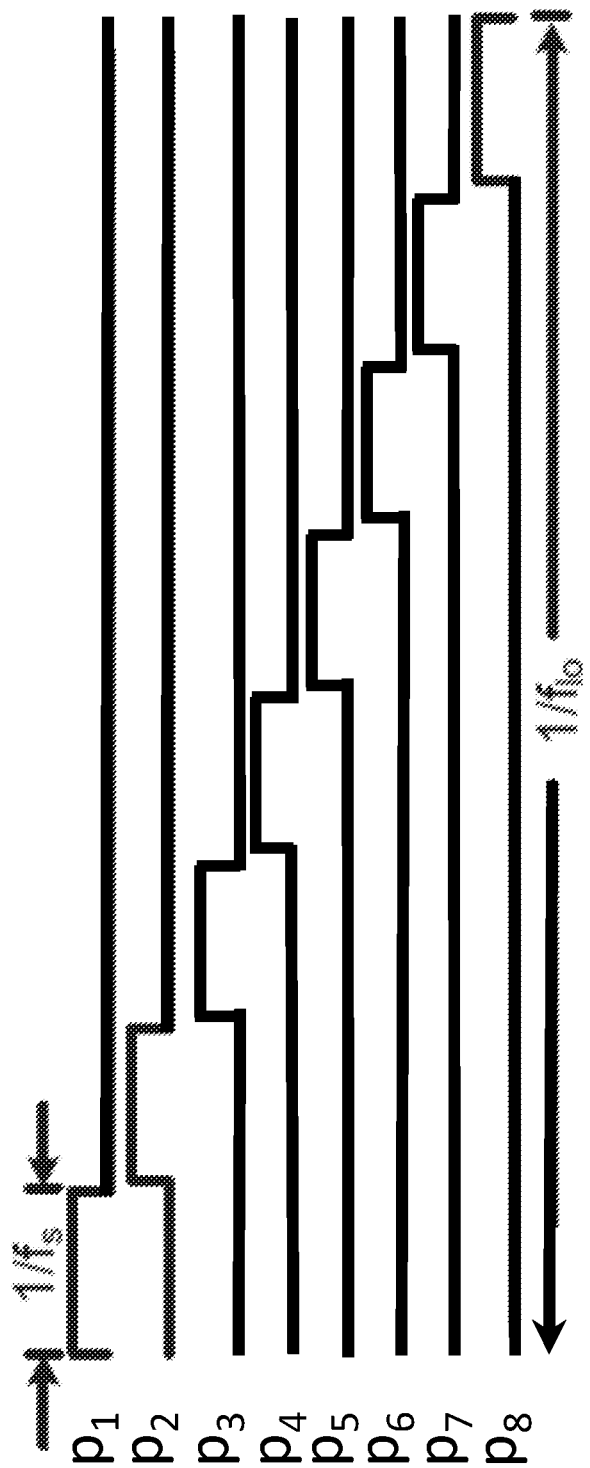
FIG. 2 is a timing diagram of an example of a multi-phase control signal for controlling switches in a front-end in accordance with some embodiments.

In some embodiments, switches $s_0$ 112, $s_1$ 114, $s_2$ 116, $s_3$ 118, $s_4$ 120, $s_5$ 122, and $s_6$ 124 can be driven by a multi-phase, non-overlapping clock signal p⟨i⟩ as shown in FIG. 2. More particularly, for example, for Bank #1, as shown, switch $s_0$ 112 can be driven by $p_1$, switch $s_1$ 114 can be driven by $p_1$, switch $s_2$ 116 can be driven by $p_2$, switch $s_3$ 118 can be driven by $p_3$, switch $s_4$ 120 can be driven by $p_4$, switch $s_5$ 122 can be driven by $p_5$, and switch $s_6$ 124 can be driven by $p_7$.

As also shown in FIG. 2, when there are eight phases, the sampling frequency is $f_s$, and the equivalent local oscillator (LO) frequency of this zero-intermediate-frequency receiver is $f_{lo}=f_s/8$.

Although eight phases $p_1, \ldots, p_8$ are illustrated herein, any suitable number of phases can be used in some embodiments.

Figure 3:
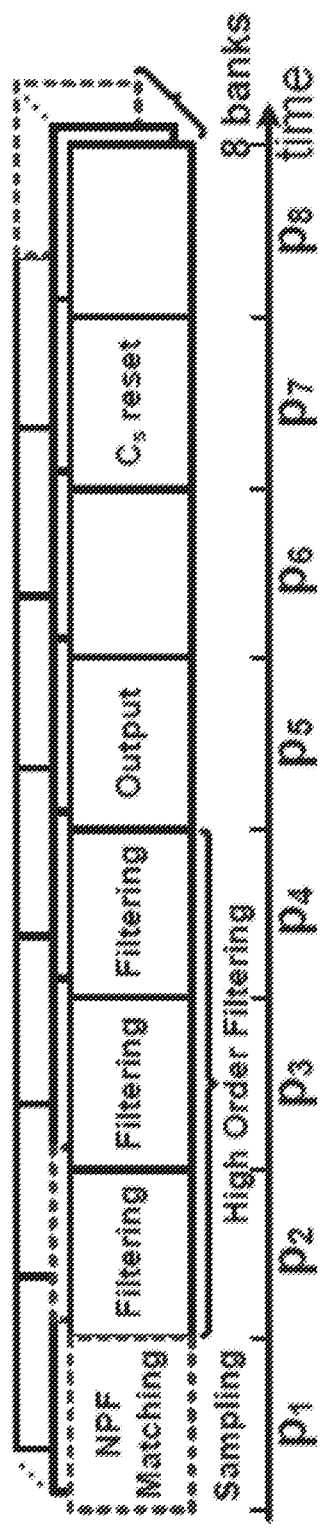
FIG. 3 is a timing diagram of an example of sequential time intervals of a front-end in accordance with some embodiments.

The SC front-end achieves different circuit functions in sequential time intervals as shown in FIG. 3. These functions are shifted in time (interleaved) for each bank.

For example, for SC Bank #1, the RF signal is sampled on Cs in phase $p_1$, propagated to the Gm input node in phase $p_5$, and dumped to ground in phase $p_7$. From phases $p_2$ to $p_4$, the signal is filtered with increasing order.

For example, for SC Bank #2, the RF signal is sampled on Cs in phase $p_2$, propagated to the Gm input node in phase $p_6$, and dumped to ground in phase $p_8$. From phases $p_3$ to $p_5$, the signal is filtered with increasing order.

For example, for SC Bank #3, the RF signal is sampled on Cs in phase $p_3$, propagated to the Gm input node in phase $p_7$, and dumped to ground in phase $p_1$. From phases $p_4$ to $p_6$, the signal is filtered with increasing order.

For example, for SC Bank #4, the RF signal is sampled on Cs in phase $p_4$, propagated to the Gm input node in phase $p_8$, and dumped to ground in phase $p_2$. From phases $p_5$ to $p_7$, the signal is filtered with increasing order.

For example, for SC Bank #5, the RF signal is sampled on Cs in phase $p_5$, propagated to the Gm input node in phase $p_1$, and dumped to ground in phase $p_3$. From phases $p_6$ to $p_8$, the signal is filtered with increasing order.

For example, for SC Bank #6, the RF signal is sampled on Cs in phase $p_6$, propagated to the Gm input node in phase $p_2$, and dumped to ground in phase $p_4$. From phases $p_7$ to $p_1$, the signal is filtered with increasing order.

For example, for SC Bank #7, the RF signal is sampled on Cs in phase $p_7$, propagated to the Gm input node in phase $p_3$, and dumped to ground in phase $p_5$. From phases $p_8$ to $p_2$, the signal is filtered with increasing order.

For example, for SC Bank #8, the RF signal is sampled on Cs in phase $p_8$, propagated to the Gm input node in phase $p_4$, and dumped to ground in phase $p_6$. From phases $p_1$ to $p_3$, the signal is filtered with increasing order.

The blank time intervals (e.g., phases $p_6$ and $p_8$ for Bank #1) relax the timing constraints.

Figure 4:
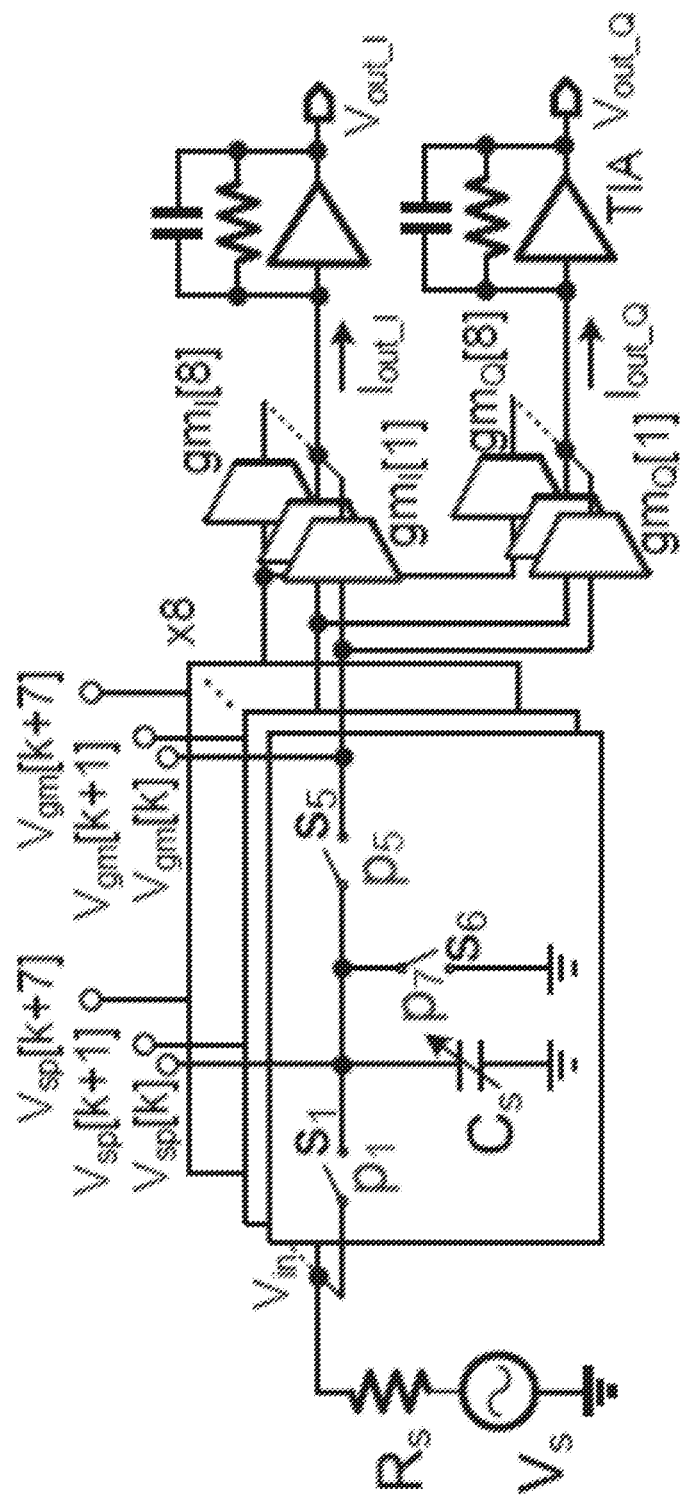
FIG. 4 is a block diagram of an example of a SC front-end without filtering in accordance with some embodiments.

FIG. 4 shows an example of a representation of the SC front-end without filtering. Because the switches $s_1\langle i\rangle$ in the eight banks are turned ON one after another in phases $p_1$ through $p_8$, respectively, the input signal is consecutively sampled on the capacitors $C_s\langle i\rangle$ in the eight banks. Those sampled voltages, $V_{sp}[k]$ to $V_{sp}[k+7]$ (k=8·1, l is an integer), can be considered as one time-interleaved signal $V_{sp}[n]$ with sampling frequency $f_s$.

Figure 5:
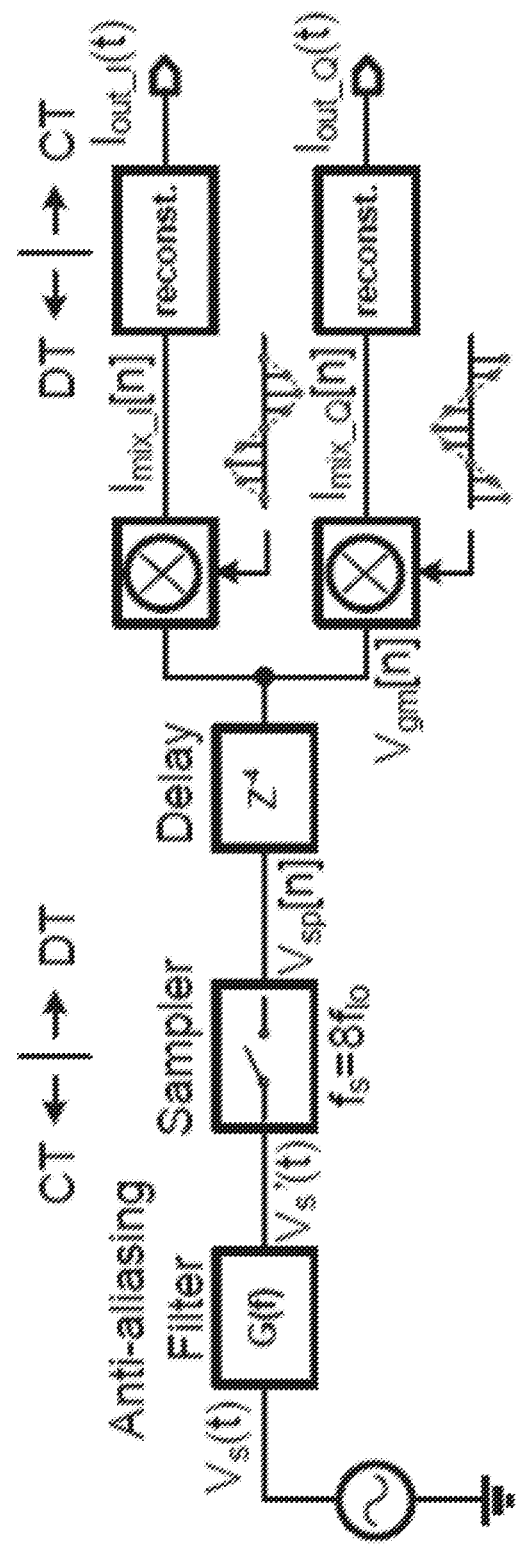
FIG. 5 is a block diagram of an example of Gm cells modeled as a discrete time (DT) mixer with a reconstruction circuit in accordance with some embodiments.

As shown in FIG. 5, in some embodiments, the sampler can be mathematically modeled as an ideal sampler with a CT anti-aliasing filter G(f). The signal $V_{sp}[n]$ is propagated to the inputs of the Gm cells after a delay of $4/f_s$. As also shown in FIG. 5, the Gm cells can be modeled as a DT mixer with a reconstruction circuit converting the DT voltage to a CT current.

Figure 6:
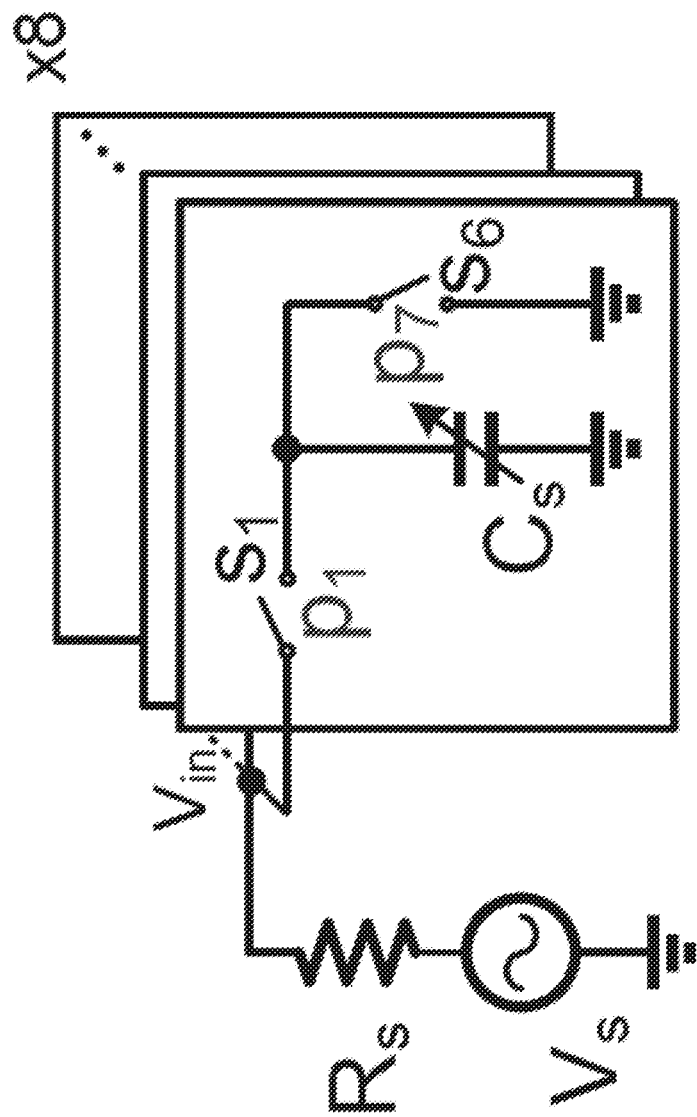
FIG. 6 is a block diagram of an example of a sampler in accordance with some embodiments.

Turning to FIG. 6, RF input impedance matching can be achieved in the SC front-end by charging and discharging $C_s$ ⟨i⟩. Because $V_{in} = Z_{in}/(Z_{in}+R_s) \cdot V_s$, the input impedance can be calculated from $V_{in}$ and $V_s$. To analyze $V_{in}$, a linear periodically time varying (LPTV) approach can be used since the matching circuit is a CT SC system. In an LPTV system, the frequency domain input voltage $V_{in}(f)$ is a summation of filtered source voltage $V_s(f)$ with frequency shifts:

$$V_{in}(f) = \sum_{n=-\infty}^{\infty} H_n(f) V_s(f-nf_s) \quad (1)$$

To calculate the input impedance $Z_{in}(f)$, $H_0(f)$ in (1) is needed. The input impedance can be calculated by $Z_{in}(f) = H_0(f)/(1-H_0(f)) \cdot R_s$. $H_0$ can be represented by:

$$H_0(f) = \frac{1}{1+jf/f_{rc}} \left[ 1 - \frac{f_s/2\pi f_{rc}}{1+jf/f_{rc}} (1 - e^{-2\pi(f_{rc}+jf)/f_s}) \right] \quad (2)$$

where $f_{rc} = 1/(2\pi R_s C_s)$, and $f_s$ is the sampling frequency. The input admittance ($Y_{in}(f) = 1/Z_{in}(f)$) can now be expressed as:

$$Y_{in}(f) = \frac{jf/f_{rc} - (f/f_{rc})^2 + f_s/2\pi f_{rc}(1 - e^{-2\pi(f_{rc}+jf)/f_s})}{1 + jf/f_{rc} - f_s/2\pi f_{rc}(1 - e^{-2\pi(f_{rc}+jf)/f_s})} \cdot \frac{1}{R_s} \quad (3)$$

The admittance is a function of $f_{rc}$. To match the DC input admittance to $1/R_s$, $Y_{in}(0) = 1/R_s$. Evaluating (3) at DC and equating it to $1/R_s$, the equation for $f_{rc}$ is $$e^{-2\pi f_{rc}/f_s} + \frac{2\pi f_{rc}/f_s}{2} - 1 = 0 \quad (4)$$

Solving this transcendental equation, results in $f_{rc} \approx 0.25 f_s$ and $C_s \approx 0.63/f_s R_s$, so the $C_s$ needs to be tuned with different LO frequencies. Using (4) and given that $\exp(-2\pi f_{rc}/f_s)$ is small, the input admittance can now be simplified to:

$$Y_{in}(f) = \left( \frac{1 + 2(f/f_{rc})^2}{1 + 4(f/f_{rc})^2} + j \frac{4(f/f_{rc})^3}{1 + 4(f/f_{rc})^2} \right) \cdot \frac{1}{R_s} \quad (5)$$

Figure 7:
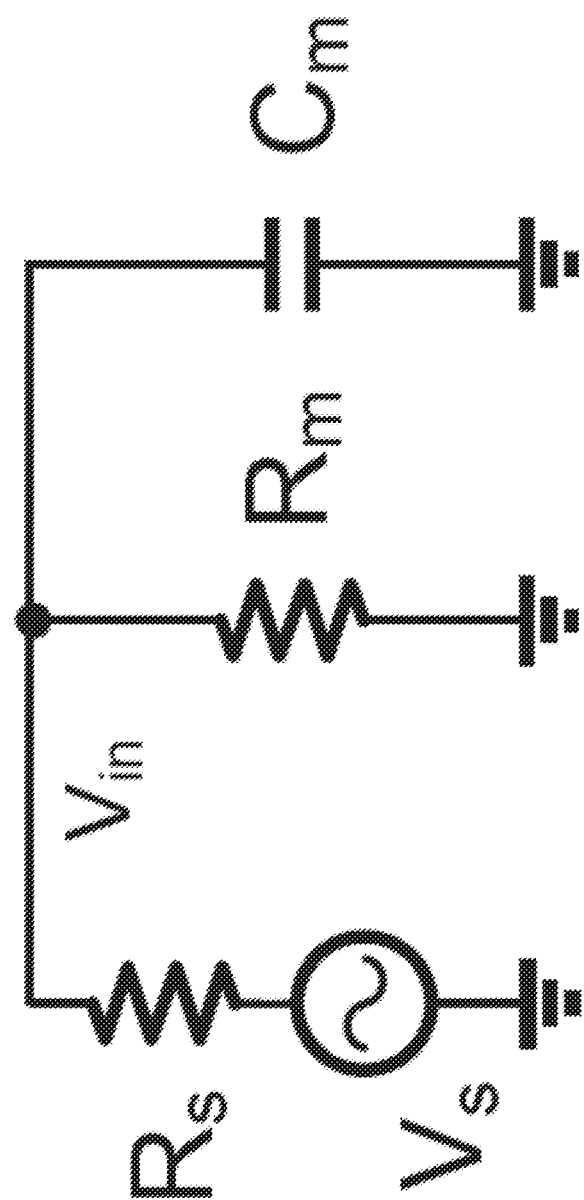
FIG. 7 is a block diagram of a model of a sampler in accordance with some embodiments.

At low frequencies ($f \ll f_{rc}$), the real part is dominant and equal to $1/R_s$. At high frequencies ($f \gg f_{rc}$), the imaginary part becomes larger, which can be modeled as a capacitor equal to $C_s$. The input impedance of the SC front-end can thus be modeled as a resistor $R_m = R_s$ in parallel with a capacitor $C_m = C_s$ as shown in FIG. 7. Considering $f_{rc} \approx 0.25 f_s$, $Y_{in}(f)$ can be normalized by $f_s$.

Figure 8:
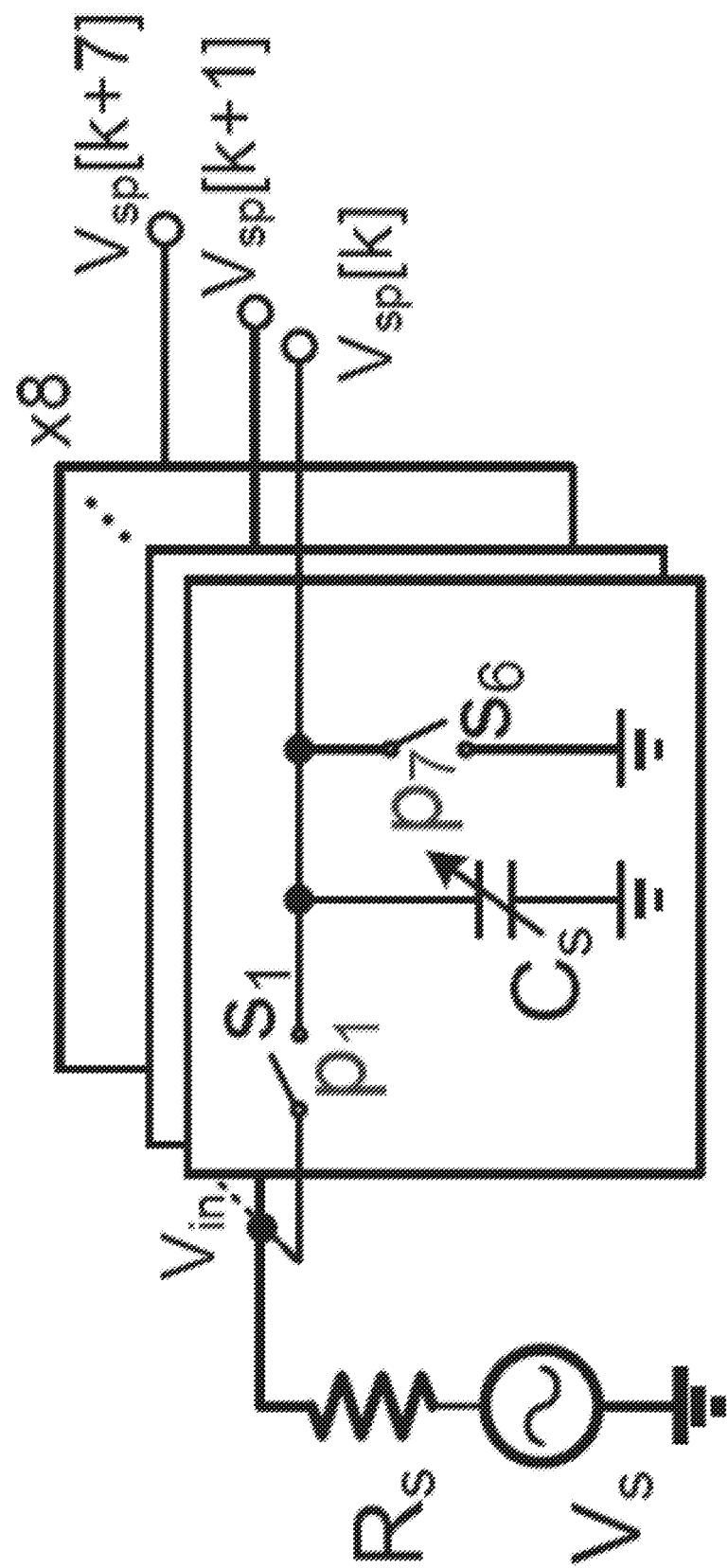
FIG. 8 is a block diagram of an example of a sampler over multiple banks in accordance with some embodiments.
Figure 9:
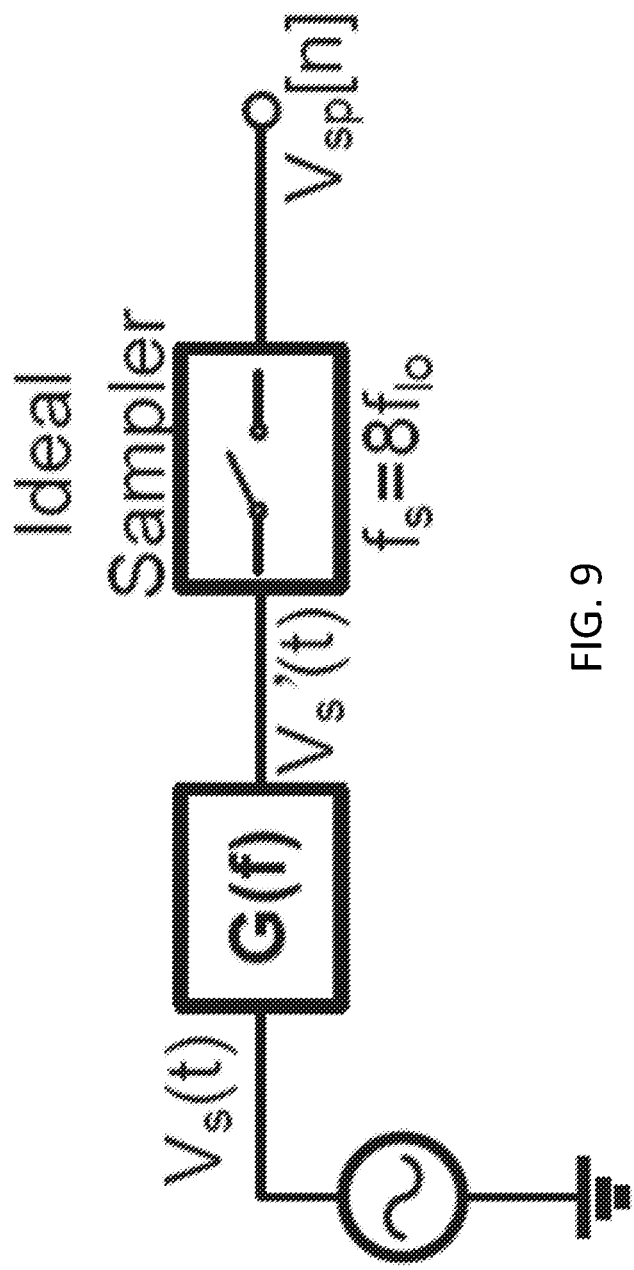
FIG. 9 is a block diagram of sampler modeled as a continuous time (CT) filter and an ideal sampler in accordance with some embodiments.

Turning to FIG. 8, as set forth above, the RF sampler includes switches $s_1$ and $s_6$ and capacitor $C_s$, and can be modeled as a CT filter G(f) and an ideal sampler, as shown in FIG. 9. In some embodiments, the G(f) can be represented by the following equation:

$$G(f) = \frac{1}{1+jf/f_{rc}} \cdot \left[ 1 - e^{-2\pi(f_{rc}+jf)/f_s} \right] \quad (6)$$

The first part of the right side of equation (6) (that is, the part to the left of the "·") is a first-order low-pass filter with a constant of $R_s C_s$ ($f_{rc} = 1/(2\pi R_s C_s)$) while the second part of the right side of equation (6) (that is, the part to the right of the "·") is a FIR filter with a delay of $1/f_s$. Considering $f_{rc} \approx 0.25 f_s$, G(f) can be normalized by $f_s$.

Figure 10:
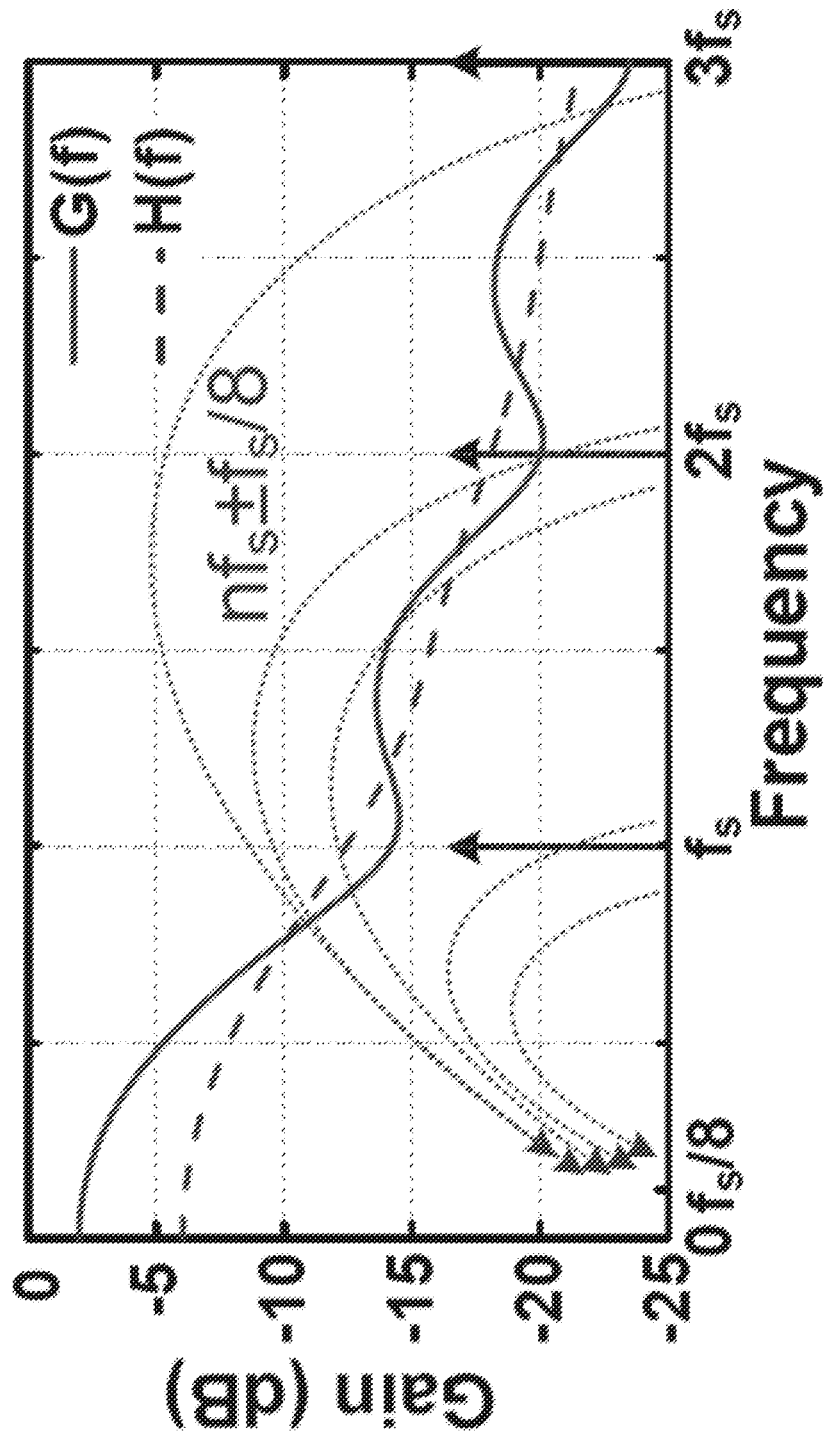
FIG. 10 is an illustration of an example of G(f) and H(f) curves in accordance with some embodiments.
Figure 11:
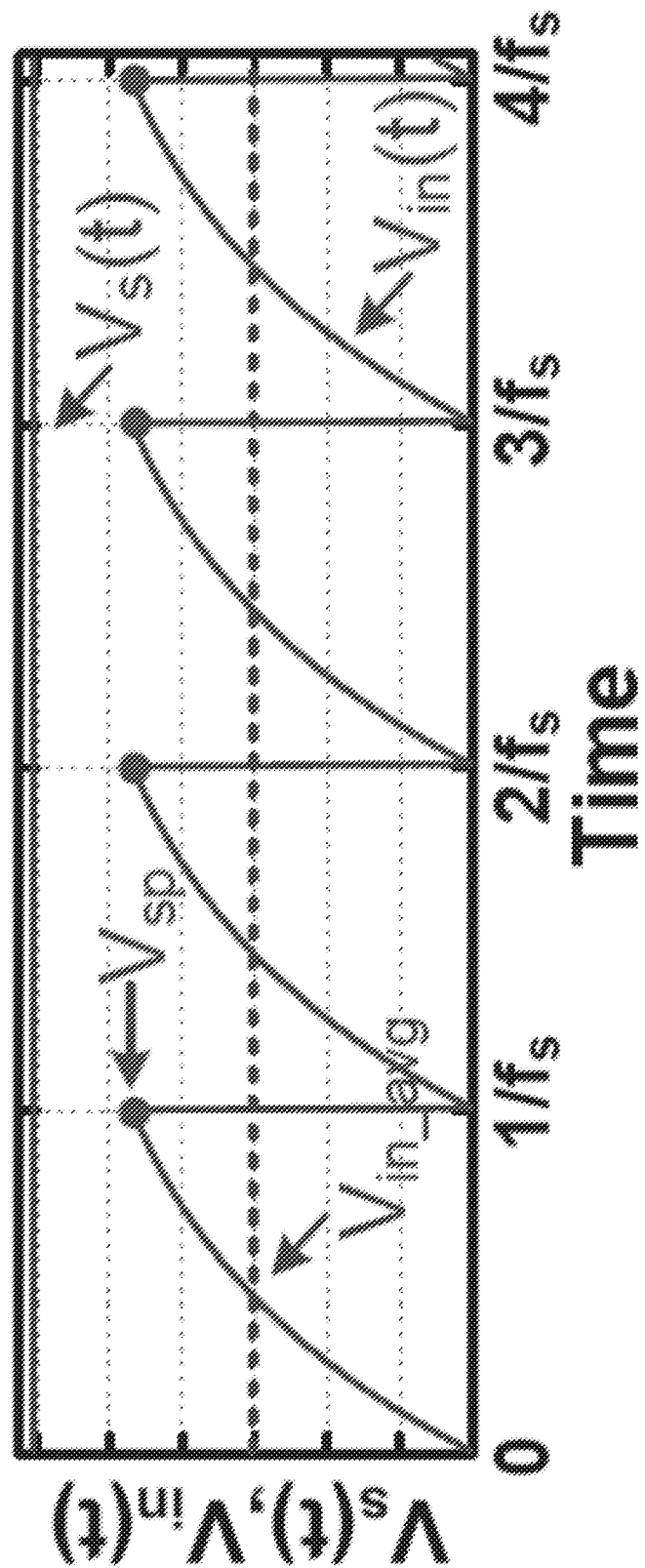
FIG. 11 is an illustration of an example of the charging of a sampling capacitor in accordance with some embodiments.

FIG. 10 shows an example of G(f) and H(f) ($=V_{in}/V_s$) transfer curves in accordance with some embodiments. Because the input impedance is matched to $R_s$ in this example, the gain of H(f) at the LO frequency ($f_s/8$) is −6 dB as in resistive matching, while G(f) is −2.2 dB. This means that the sampler provides a 3.8 dB passive gain ($V_s'/V_{in}$) (in this example) because, when the switch $s_1$ is turned ON, the $C_s$ voltage is charged from zero to $V_{sp}$, while $V_{in}$ is the "average" voltage of the whole charging period as shown in the example $V_{in}$ transient wave form for a DC (0 Hz) source voltage $V_s$ in FIG. 11.

During operation, the sampler exhibits characteristics of both a voltage sampler and an integration sampler.

In a voltage sampler, a sampling capacitor voltage follows the source voltage when the switch is turned ON, and the high-frequency signals around the sampling frequency (and its harmonics) are folded into the desired signal band. In an integration sampler, when the switch is turned ON, a sampling capacitor voltage is the integral of the source current ($I_s = V_s/R_s$). The integration sampler has intrinsic anti-aliasing filtering with nulls at $n \cdot f_f$ (where n is a non-zero integer).

A difference between a voltage sampler and an integration sampler is that the integration sampler incorporates a FIR filter (e.g., like the second part of the right side of equation (6) (that is, the part to the right of the "·")). This is because, in a voltage sampler, the RC constant is relatively small ($R_s C_s \ll 1/f_s$) and thus the FIR part in G(f) can be ignored. In an integration sampler, however, the RC constant is large ($R_s C_s \gg 1/f_s$) and thus the FIR filter generates deep nulls at the sampling frequency (and its harmonics) which reduces aliasing.

Because, in some embodiments of the front-end described herein, the RC constant is close to the sampling period, the sampler of the described front-end can exhibit characteristics of both a voltage sampler and an integration sampler. Using $f_{rc} \approx 0.25 f_s$, the bandwidth of the RC-filtering part in G(f) is around $0.25 f_s$. Also, the FIR filtering part in G(f) provides more attenuation around the sampling frequency and its harmonics, although the attenuation is lower than in a typical integration sampler. The G(f) transfer function in accordance with some embodiments is shown in FIG. 10. The G(f) provides rejection to reduce the signal and noise folding from $n \cdot f_s \pm f_s/8$.

In some embodiments, Gm cells 104 (FIG. 1) can be modeled as a DT mixer with a reconstruction circuit.

The DT mixing can be expressed as: $I_{mix\_\{I,Q\}}[n] = V_{gm}[n] \cdot gm_{\{I,Q\}}[\text{mod}(n, 8)+1]$, where mod(·) is the modulus function. By scaling gm[i] as a DT sine wave, a down-converted {I, Q} signal can be obtained at the mixer output. In some embodiments, the gm factors gm[1] to gm[8] in the I path (i.e., the gm corresponding to the I path for each of the i banks) need to be sized as $\sin((i-1)\cdot 4/\pi)$, which are 0, 1, $\sqrt{2}$, 1, 0, −1, −$\sqrt{2}$, −1, 0, while the gm factors gm[1] to gm[8] in the Q path (i.e., the gm corresponding to the Q path for each of the i banks) need to be sized as $-\cos((i-1)\cdot 4/\pi)$ (as in a harmonic rejecting mixer (HRM)), which are 0, 1, $\sqrt{2}$, 1, 0, −1, −$\sqrt{2}$, −1, 0. So, only the signal around $f_s/8$ in the Nyquist bandwidth $f_s/2$ will be down-converted to baseband. Non-idealities, like gain and phase mismatches, will reduce the harmonic rejection ratio (HRR) as in other HRM.

In some embodiments, besides performing down-conversion, the Gm cells also convert the signal from the DT to the CT domain. The reconstruction can be implemented as a zero-order hold with a hold time of $8T_s$ ($T_s=1/f_s$); the output current can be expressed as:

$$I_{out\_\{I,Q\}}(t)=\Sigma_{n=-\infty}^{\infty} I_{mix\_\{I,Q\}}[n] \cdot rect((t-4T_s-nT_s)/8T_s),$$

where rect(·) is the rectangular function.

Combining anti-aliasing filtering, sampling, DT mixing with harmonic rejection and reconstruction, the conversion gain of the front-end can be represented by:

$$CG(f_{in}) = \frac{V_{out}\left(f_{in}-\frac{f_s}{8}\right)}{V_s(f_{in})} =$$

$$G(f_{in}) \cdot \frac{1}{T_s} \cdot \frac{1}{2} gm \cdot 8T_s \text{sinc}\left(\pi\frac{f_{in}-f_s/8}{f_s/8}\right) \cdot R \approx 4G(f_{in})gmR,$$

where $f_{in}$ is the input RF frequency around LO frequency of $f_s/8$, gm is the transconductance of the Gm cell with a size of $\sqrt{2}$, and R is the feedback resistor in the TIA. The sinc function approximates to 1 for $f_{in}$ close to $f_s/8$.

Figure 12:
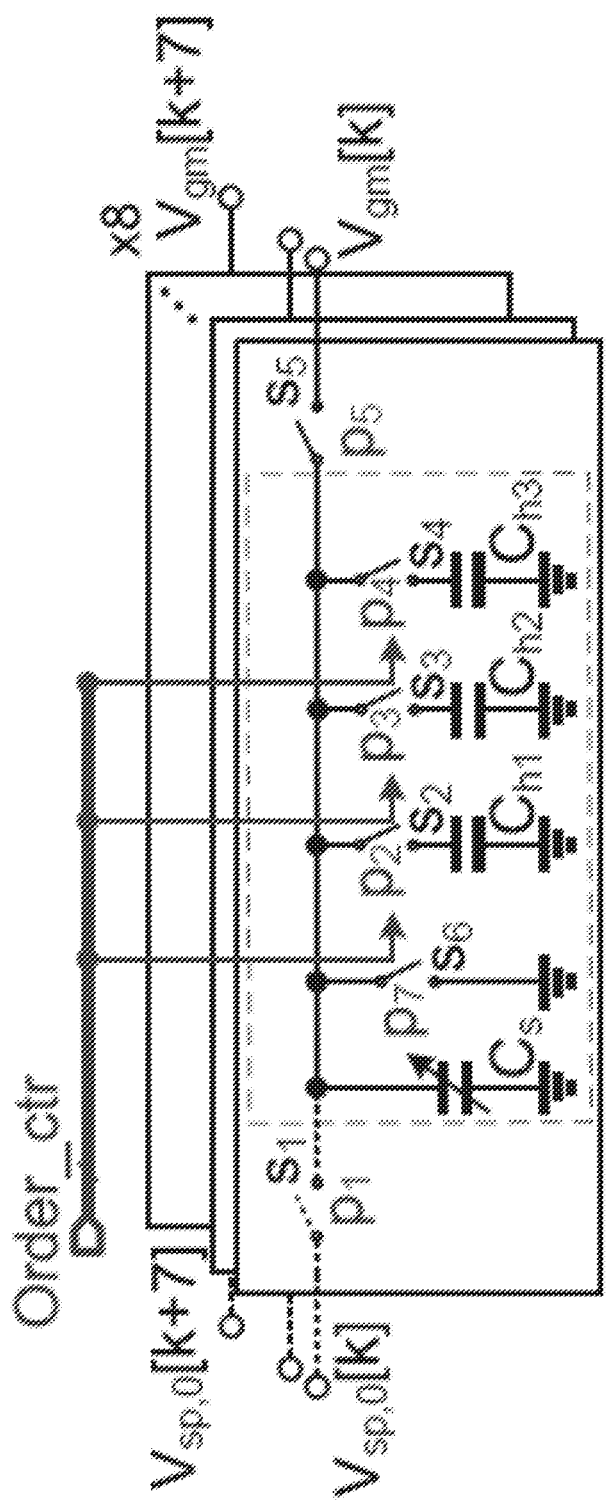
FIG. 12 is a block diagram of an example of a DT infinite-impulse response (IIR) filter in accordance with some embodiments.

The DT IIR filter includes capacitors $C_s$, $C_{h1}$, $C_{h2}$, and $C_{h3}$ and switches $s_2$, $s_3$, $s_4$, and $s_6$ as shown in FIG. 12. In some embodiments, this filter can be implemented by charge rotating. For example, in each cycle n of $8/f_s$, after each capacitor $C_s$ is charged to the finite state $V_{sp,0}$ during its sampling phase (e.g., phase $p_1$ for Bank #1), the capacitor $C_s$ is sequentially connected to capacitors $C_{h1}$, $C_{h2}$, and $C_{h3}$, the input node of the Gm cell, and ground (e.g., during phases $p_2$, $p_3$, $p_4$, $p_5$, and $p_7$, respectively, for Bank #1). When $C_{hi}$ (e.g., $C_{h1}$, $C_{h2}$, or $C_{h3}$) connects to $C_s$, the $C_s$ voltage and $C_{hi}$ voltage after charge sharing are:

$$V_{sp,i}[n]=V_{h,i}[n]=\alpha V_{h,i}[n-8]+(1-\alpha)V_{sp,i-1}[n-1], \quad (8)$$

where $\alpha=C_{hi}/(C_{hi}+C_s)$, i={1,2,3}, $V_{h,i}$ is the $C_{hi}$ voltage, $V_{sp,i}$ is the $C_s$ voltage after it connects to $C_{hi}$. Writing (8) in the z domain with $z=\exp(j2\pi f/f_s)$, the $C_s$ voltage can be expressed as $$V_{sp,i}(z) = \frac{1-\alpha}{1-\alpha z^{-8}} \cdot z^{-1} \cdot V_{sp,i-1}(z) \quad (9)$$

This shows that each $C_{hi}$ provides a first-order IIR filtering. If $C_{hi}$ is not connected, the transfer function (9) is just a delay ($z^{-1}$). The filter order can thus be tuned by enabling or disabling the clock signal for $s_i$ connected to $C_{hi}$. When the clock signal is disabled, its clock driver can be turned off to save power providing a trade-off between filter order and power consumption.

Figure 13:
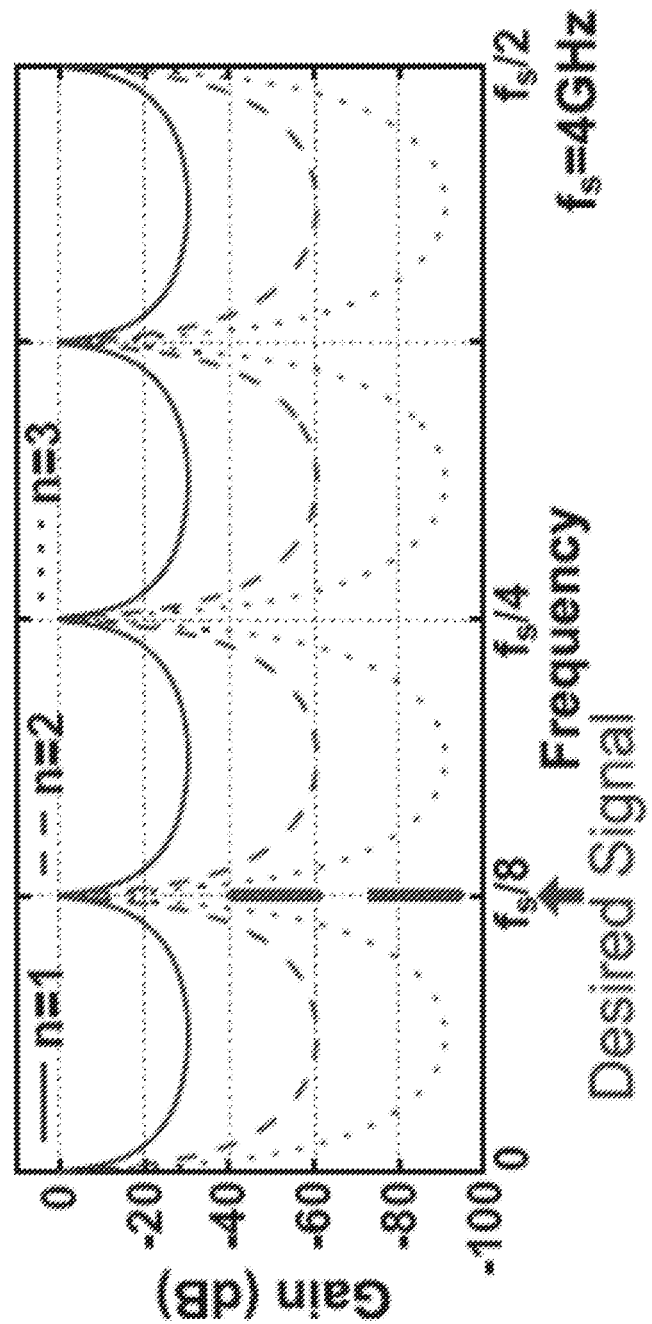
FIG. 13 is an illustration of an example of calculated IIR filter transfer curves in accordance with some embodiments.

Since $V_{gm}[n]=V_{sp,3}[n-1]$, the transfer function of the whole IIR filter can be represented by:

$$\frac{V_{gm}(z)}{V_{sp}(z)} = \left(\frac{1-\alpha}{1-\alpha z^{-8}}\right)^n \cdot z^{-4} \quad (10)$$

where $V_{sp}=V_{sp,0}$, and n is the number of $C_{hn}$ being connected, n={0,1,2,3}, which is also the IIR filter order. FIG. 13 shows an example of calculated IIR filter transfer curves in the Nyquist bandwidth for different filter orders with $f_s=4$ GHz, $C_s \approx 0.63/f_s R_s$, and $C_{hn}=50$ pF, n={0,1,2,3}. The DC and even-order LO harmonic responses can be removed using differential circuits.

In a DT IIR filter, the bandwidth changes with sampling frequency, since it is proportional to $f_s C_s/8C_{hn}$. In some embodiments, $C_s$ is tuned to $0.63/f_s R_s$ to achieve the impedance matching. So, the bandwidth is proportional to 0.63/8 ($R_s C_{hn}$) and independent of $f_s$. Thus the filter bandwidth doesn't change when changing LO frequencies ($f_{lo}=f_s/8$) and can be tuned by $C_{hn}$. In some embodiments, $C_{hn}$ is fixed.

Figure 14:
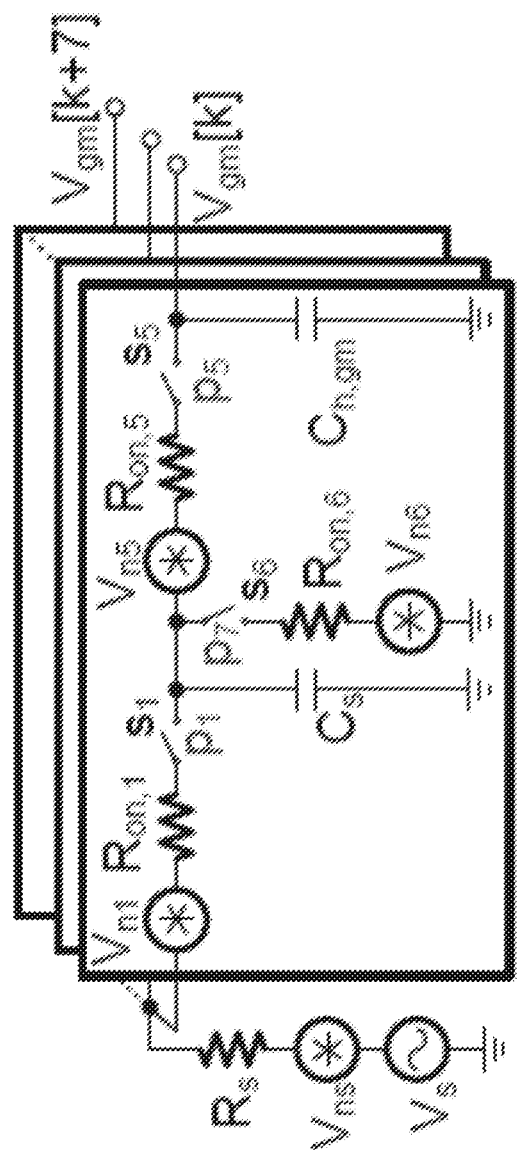
FIG. 14 is a block diagram of an example of noises sources in the front-end without filtering in accordance with some embodiments.
Figure 15:
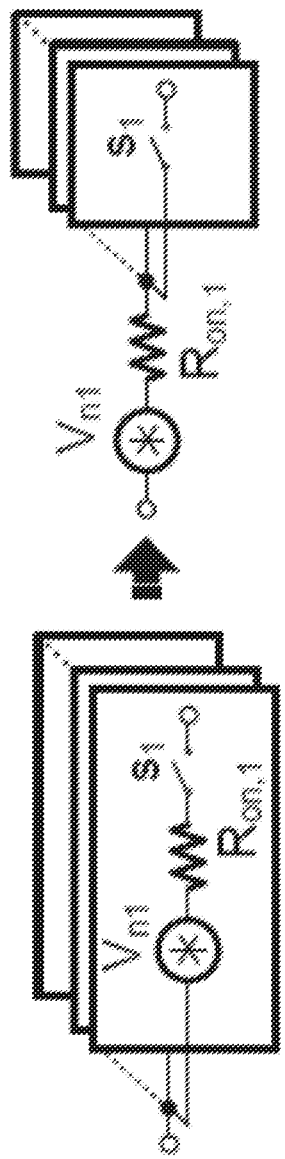
FIG. 15 is an illustration of an example of white noise from multiple banks be merged into one representation in accordance with some embodiments.
Figure 18:
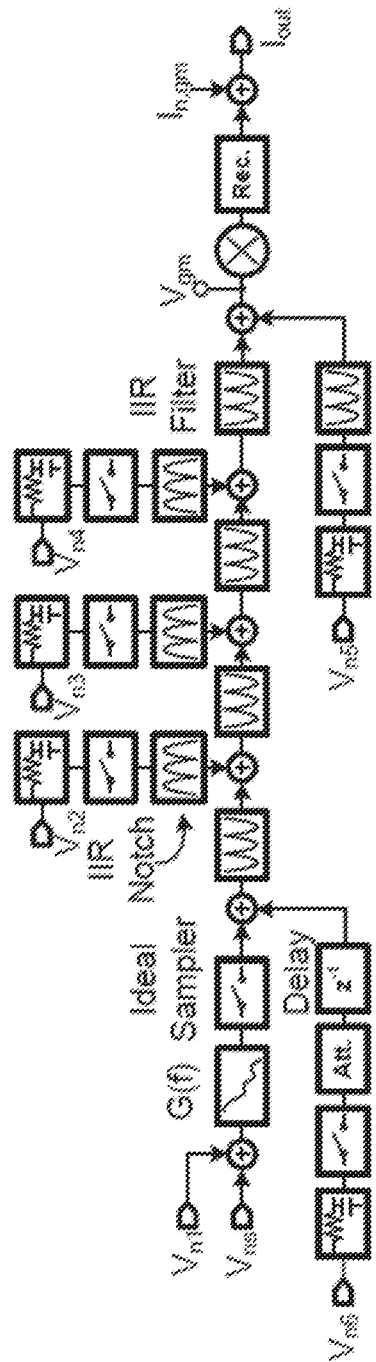
FIG. 18 is a block diagram of a model to calculate the propagation of noise in a front-end in accordance with some embodiments.

In the SC front-end, in some embodiments, the added noise is mainly the thermal noise of the switches. FIG. 14 shows an illustrative representation of the noise sources of the SC front-end without filtering in accordance with some embodiments. Switch $s_i$ is modeled as an ideal switch in series with a parasitic resistor $R_{on,i}$ and a noise voltage $V_{n,i}$. $C_{h,gm}$ is the parasitic capacitor of the Gm cell. Since there is no overlap between the clock signals driving $s_1\langle i \rangle$ in the eight SC banks, all the white noise source $V_{n1}\langle i \rangle$ can be merged into a single white noise source, $V_{n1}$, as shown in FIG. 15. The sampling switch, $s_1$, noise is thus added to the source noise $V_{ns}$ as shown in FIG. 18 since $R_{on}$ is in series with $R_s$. The intrinsic antialiasing filter, G(f), reduces the high-frequency noise folding.

The resetting-switch, $s_6$, noise is first sampled on $C_s$. Together, $C_s$ and $s_6$ are a voltage sampler ($R_{on,6}C_s \ll 1/f_s$) so that the high-frequency noise is folded into the signal band after sampling, resulting in a nearly white noise. The noise spectral density is the total mean-square (MS) noise voltage, $kT/C_s$, divided by Nyquist bandwidth, $f_s/2$. Then, this sampled noise voltage is partially dumped by $R_s$ when $s_1$ is turned ON for a duration of $1/f_s$ and the noise voltage is reduced by a factor of $\exp(-2\pi f_r/f_s)$. After that, the noise voltage is added to the desired signal as shown in FIG. 18. The noise spectral density at the Gm input node in the signal band due to $V_{n6}$ is:

$$\overline{V_{gm,n6}^2} = \frac{2kT}{C_s f_s} e^{-1/f_s C_s R_s} \cdot \Delta f \quad (11)$$

Figure 16:
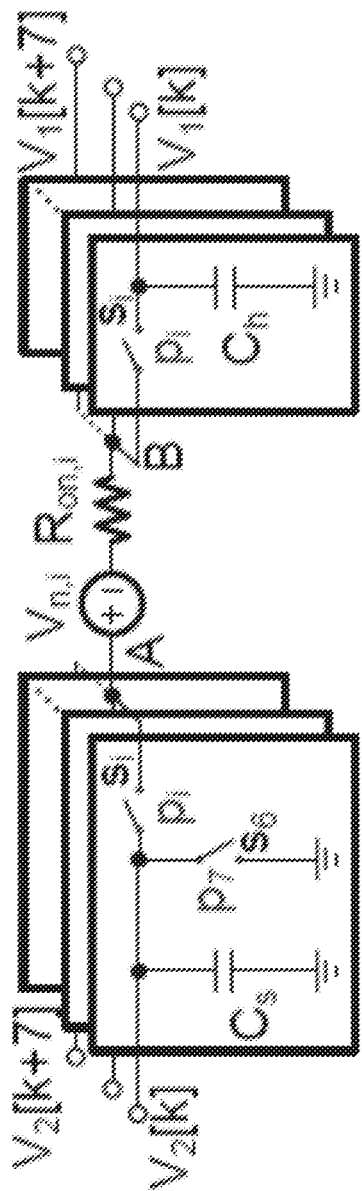
FIG. 16 is a block diagram for analyzing noise in accordance with some embodiments.

Since the noise analyses of the switch $s_5$ and the switches in the IIR filter are related, the same equivalent schematic in FIG. 16 can be used to analyze the noise transfer functions of these switches; $V_{n,i}$ is the noise voltage source of switch $s_i$, i={2,3,4,5}; for the $s_5$ noise analysis, $C_h$ is $C_{h,gm}$ and for the noise analysis of the $s_{j+1}$ in the IIR filter, $C_h$ is $C_{hj}$, j={1,2,3}. When $s_i$ is turned ON, $V_{n,i}$ is sampled on $C_s$ in series with $C_h$. Let $V_{n,sp}$ be the sampled noise voltage between node A and B in FIG. 16 with an MS value of $kT/\alpha C_s$, where $\alpha=C_h/(C_h+C_s)$. The DT voltages on $C_h$ and $C_s$ are $$V_1[n]=-(1-\alpha)V_{n,sp}[n]+\alpha V_1[n-1], V_2[n]=\alpha V_{n,sp}[n]+\alpha V_1[n-1] \quad (12)$$

Solving (12), results in:

$$H_1(z) = \frac{V_1(z)}{V_{n,sp}(z)} = -\frac{1-\alpha}{1-\alpha z^{-8}}, H_2(z) = \frac{V_2(z)}{V_{n,sp}(z)} = \alpha \frac{1-z^{-8}}{1-\alpha z^{-8}}. \quad (13)$$

Figure 17:
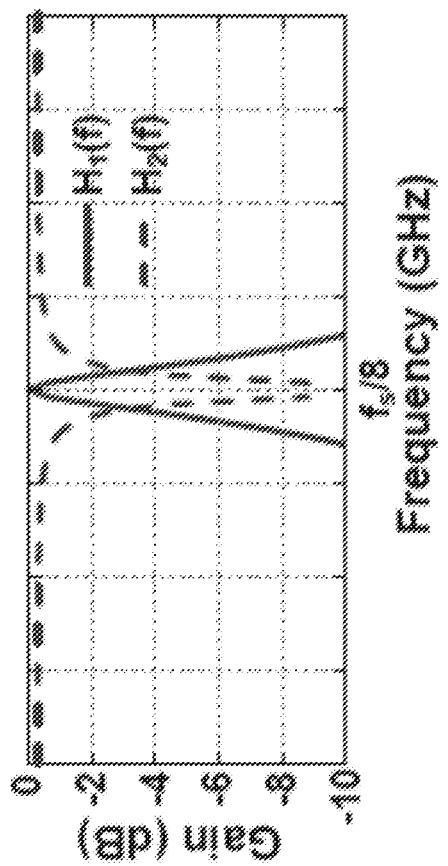
FIG. 17 is an illustration of graphs of noise transfer functions in accordance with some embodiments.

$H_1$ is the $s_5$ noise transfer function and is an IIR bandpass filter with a 0 dB in-band gain. $H_2$ is the noise transfer function for the switches in the IIR filter and is a notch filter centered at the desired signal band. An example of the calculated $H_1$ and $H_2$, with $f_s=4$ GHz and $C_h=50$ pF, are shown in FIG. 17.

The $s_5$ noise is added to the desired signal at the Gm input node, as shown in FIG. 18 with an in-band-noise spectral density of $$\overline{V_{gm,n5}^2} = \frac{2kT}{\alpha_{gm} C_s f_s} \cdot \Delta f \tag{14}$$

calculated using (13) where $\alpha_{gm}=C_{h,gm}/(C_{h,gm}+C_s)$.

The switch noise from the IIR filter is added to the desired signal when being sampled on $C_s$ with the transfer function $H_2$. The in-band filter noise is first reduced by the IIR notch filtering $H_2$, then propagated to the output as shown in FIG. 18. It can thus be ignored, and the noise factor (NF) will remain almost the same when increasing filter order.

Including the Gm cell noise $\overline{I_{n,gm}^2}=4kT\gamma(2+2\sqrt{2})gm$, the front-end's total double-sideband (DSB) noise factor at the target signal frequency ($f_{lo}=f_s/8$) is $$F = 1 + \frac{R_{on,1}}{R_s} + \frac{1}{2R_s|G(f_s/8)|^2}\left[\frac{e^{-1/f_s R_s C_s}}{f_s C_s} + \frac{1}{\alpha_{gm} f_s C_s} + \frac{\gamma(1+\sqrt{2})}{8gm}\right] \tag{15}$$

Using $C_s \approx 0.63/f_s R_s$ and $G(f_s/8)$ from equations (6) and (15) can be simplified as $$F = 1 + \frac{R_{on,1}}{R_s} + 0.27 + 1.32/\alpha_{gm} + \frac{0.25\gamma}{gmR_s} \tag{16}$$

Since $R_{on,1}$ is relatively small and $\alpha_{gm}<1$, the front-end noise factor is dominated by fourth term (i.e., the noise from $s_5$). The NF lower limit is 4.13 dB when $R_{on,1}=0$, $\alpha_{gm}=1$, and gm=+∞.

In accordance with some embodiments, to improve blocker compression, CMOS switches (FIG. 19) can be used instead of NMOS switches or PMOS switches. NMOS and PMOS transistors in the CMOS switches can have the same size of W/L=150 μm/40 nm. $V_{SW}=V_{DD}$ and $V_{SWb}=V_{SS}$ when the switch is turned on; $V_{SW}=V_{SS}$ and $V_{SWb}=V_{DD}$ when the switch is turned OFF.

Figure 20:
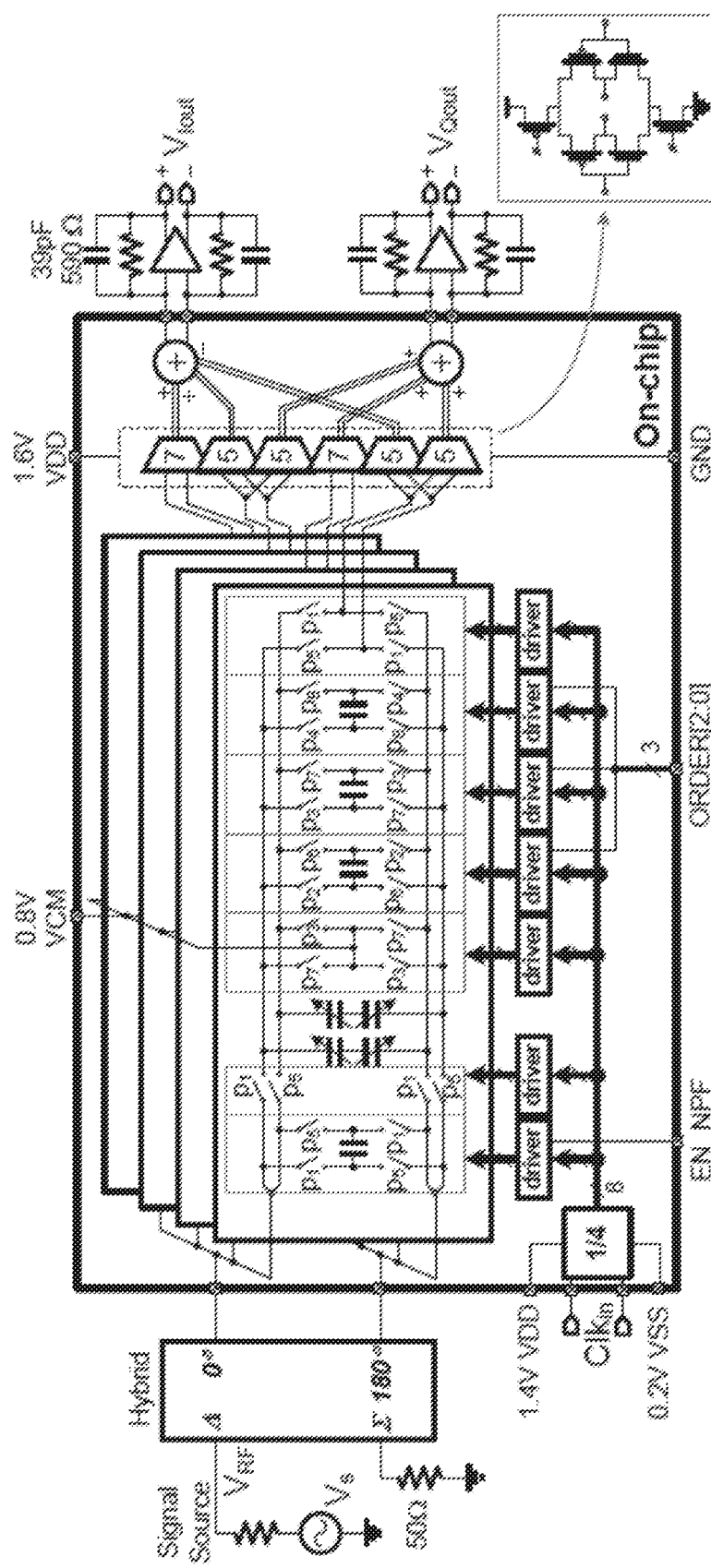
FIG. 20 is a schematic of an example of a SC RF receiver front-end in accordance with some embodiments.

An example of a schematic of an SC RF front-end in accordance with some embodiments is shown in FIG. 20.

As shown, the front-end includes SC circuits, baseband Gm cells, TIAs, and a clock generator. In a fully differential architecture, a differential NPF is used at the RF input and the two capacitors Cs with opposite phases can share the same $C_h$ in the ER filter to eliminate the DC and even-order LO harmonic responses. The corresponding two sections in FIG. 1 (e.g., sections 108 and 110) are merged into one bank in FIG. 20; as a result, eight capacitors are needed for $C_s$ and four capacitors are needed for each $C_h$. The NMOS and PMOS in the CMOS switches are sized equally to reduce the charge injection and clock feedthrough. The $R_{on}$ of the sampling switches $s_1$ and the output switches $s_5$ is 14Ω, while the other switches are sized for 20Ω. The $C_s$ is implemented with a metal-oxide-metal (MoM) capacitor bank with switches to ground. The $C_s$ tuning range is 1-16 pF with a 1 pF step. The $C_h$s are identical with an effective single-ended capacitance of 50 pF and are realized with a combination of differential MoM capacitors and MOS capacitors to ground.

The Gm cells combine the four-phase output signals from the SC circuits; each two capacitors $C_s$ with opposite phases share a single Gm cell which changes the hold time to $4T_s$ when converting the DT signal to CT.

In some embodiments, the Gm cells can be realized by CMOS inverters with a tail current operating from a 1.6 V supply. The Gm input-common-mode voltage can be set by $V_{CM}$ in the reset phase. Common-mode feedback circuits can set the output common-mode voltage to 0.8 V. A 5:7 size ratio can be used to approximate the 1:√2 ratio for the harmonic recombination to eliminate the harmonic down-conversion. Dummy Gm cells can be used to balance the load of the previous stage. The transconductance of the size-5 Gm cell can be 40 mS. To reduce the flicker noise, a large transistor can be used with a length equal to 1 μm, resulting in 40 pF input-parasitic capacitance. Since the desired signal is already down-converted when it reaches the input of the Gm cell, this parasitic capacitance should not limit the front-end's frequency range.

In some embodiments, each Gm cell can be tuned with a nine-bit control code to calibrate the harmonic rejection ratio (HRR). During the calibration, a harmonic signal can be provided at the RF input and the Gm cells can be externally tuned to minimize the baseband output power.

In some embodiments, the clock divider can generate eight non-overlapping clock signals with a ⅛ duty cycle and drive the switch drivers. The drivers for the switches in the NPF and IIR filter can be turned ON or OFF to change the filter order. The switch drivers can be DC coupled to the switches. In some embodiments, since the front-end's $V_{CM}$ is 0.8 V, and the rail-to-rail voltage is 1.2 V, the $V_{DD}$ and $V_{SS}$ of the clock generator can be chosen to be 1.4 V and 0.2 V respectively to make sure $V_{CM}=(V_{DD}-V_{SS})/2$.

Figure 21:
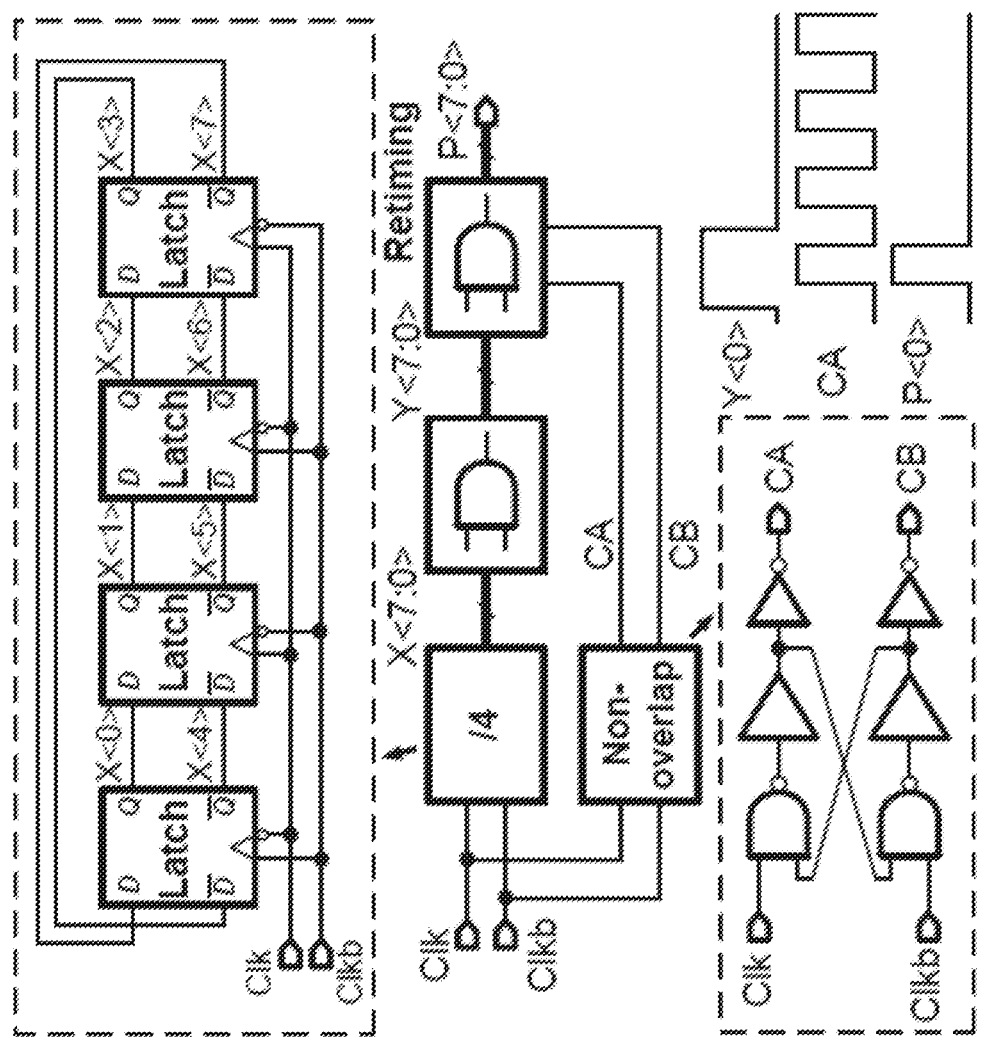
FIG. 21 is a block diagram of an example of a clock divider circuit in accordance with some embodiments.
Figure 22:
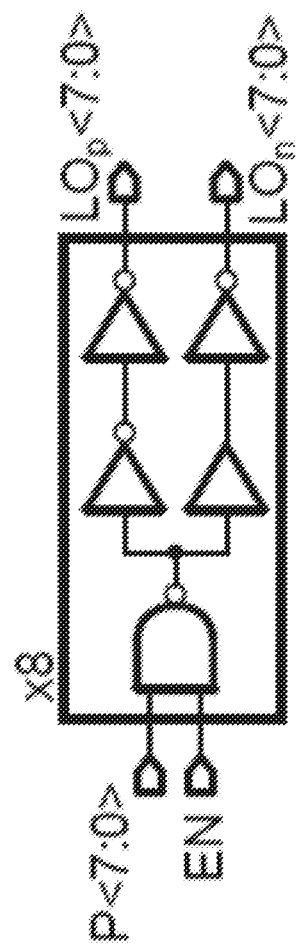
FIG. 22 is a block diagram of an example of a clock driver circuit in accordance with some embodiments.

FIG. 21 shows an example of a block diagram of the clock divider in accordance with some embodiments. The latch-based counter generates an 8-phase ½-duty-cycle clock signal X<7:0>. The latch output signals are combined by an array of AND gates to generate a ¼-duty-cycle clock Y<7:0> for the retiming circuit. After retiming by the 2-phase non-overlapping clocks CA and CB, the 8-phase ⅛-dutycycle non-overlapping clock P<7:0> can be generated. The re-timing scheme relaxes the noise requirements of the counter and the AND-gate array. The complementary clocks for CMOS switches can be generated by clock drivers and can be enabled with the signal EN as shown in FIG. 22. $LO_p$ and $LO_n$ drive the PMOS transistor and the NMOS transistor in the switch respectively. The digital buffer in the $LO_n$ branch can be used to equalize the delay of $LO_p$ and $LO_n$, and the delay mismatch can be smaller than the gap between two non-overlapping clocks.

In accordance with some embodiments, a chopping SC receiver front-end with integrated blocker detector is provided. The integrated blocker detector detects the envelope of an unknown OB blocker, so that the filter order can be adapted to the blocker power.

Figure 23:
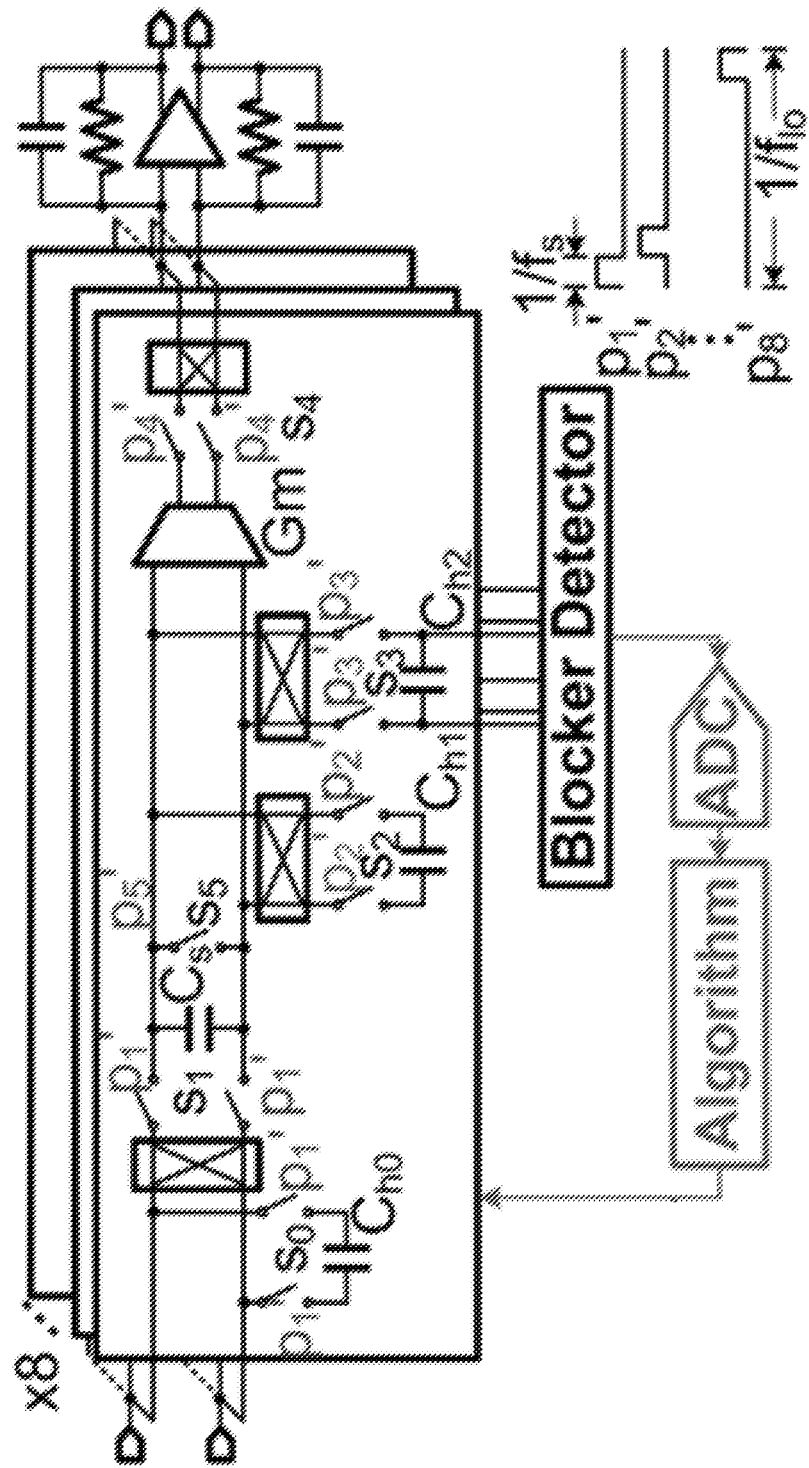
FIG. 23 is a block diagram of an example of a chopping SC receiver front-end in accordance with some embodiments.

As shown in FIG. 23, in accordance with some embodiments, a chopping SC receiver front-end can include eight time-interleaved SC banks. As described above, RF impedance matching and sampling can be achieved by capacitors $C_s$ with switches $s_1$ and $s_5$. In each SC bank, the RF input signal can be down-converted to baseband during sampling, then amplified by eight Gm cells. The transconductances of the Gm cells can be scaled as a sine wave to achieve 3rd and 5th order LO harmonic rejection.

Unlike what is shown in FIG. 1, however, the switch at the input to the Gm cells can be omitted in the chopping SC receiver front-end and moved to the output of the Gm cells.

This can cause noise to be reduced. Also unlike what is shown in FIG. 1, to reduce in-channel flicker noise, input and output choppers can be provided in the chopping SC receiver front-end. Further unlike what is shown in FIG. 1, a blocker detector can be provided and attached to the last IIR filter capacitor $C_{h2}$ to measure the filtered Gm input voltage swing.

During operation, the choppers to the left of capacitors Cs can up-convert the desired signal with chopping frequency $f_{chop}$, and the choppers to the right of the Gms can down-convert the desired signal back to baseband while up-converting the Gm flicker noise to $f_{chop}$. The choppers attached to $C_{h1}$ and $C_{h2}$ ensure the IIR filter transfer function is maintained while chopping.

Figure 24:
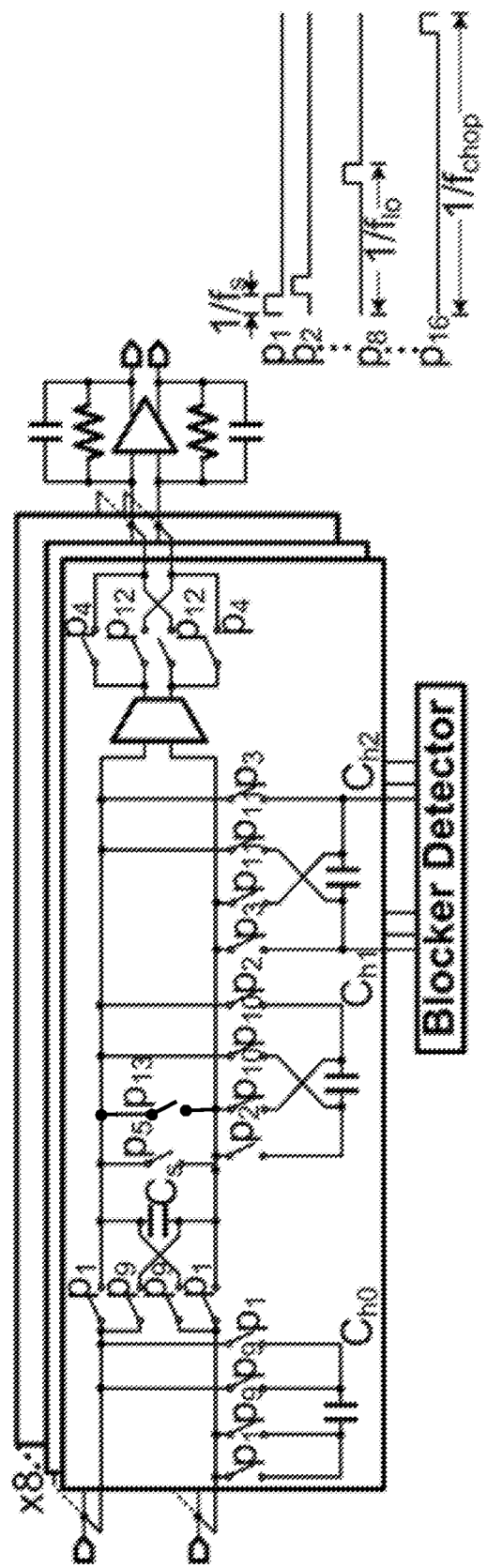
FIG. 24 is a block diagram of an example of a chopping SC receiver front-end with merged choppers in accordance with some embodiments.

In some embodiments, when driving the switches by 1/16 duty-cycle 16-phase non-overlapping clocks, the choppers can be merged with the SC circuits as shown in FIG. 24. In some embodiments, for example, chopping can then be achieved by sampling the RF input signal at each bank in phases $p_i$ (e.g., phase $p_1$ for Bank #1, phase $p_2$ for Bank #2, etc.) with one polarity and in phases $p_{i+8}$ (e.g., phase $p_9$ for Bank #1, phase $p_9$ for Bank #2, etc.) with the opposite polarity. For a sampling frequency $f_s$, the LO frequency is $f_{lo}=f_s/8$ and $f_{chop}=f_s/16$.

Figure 25:
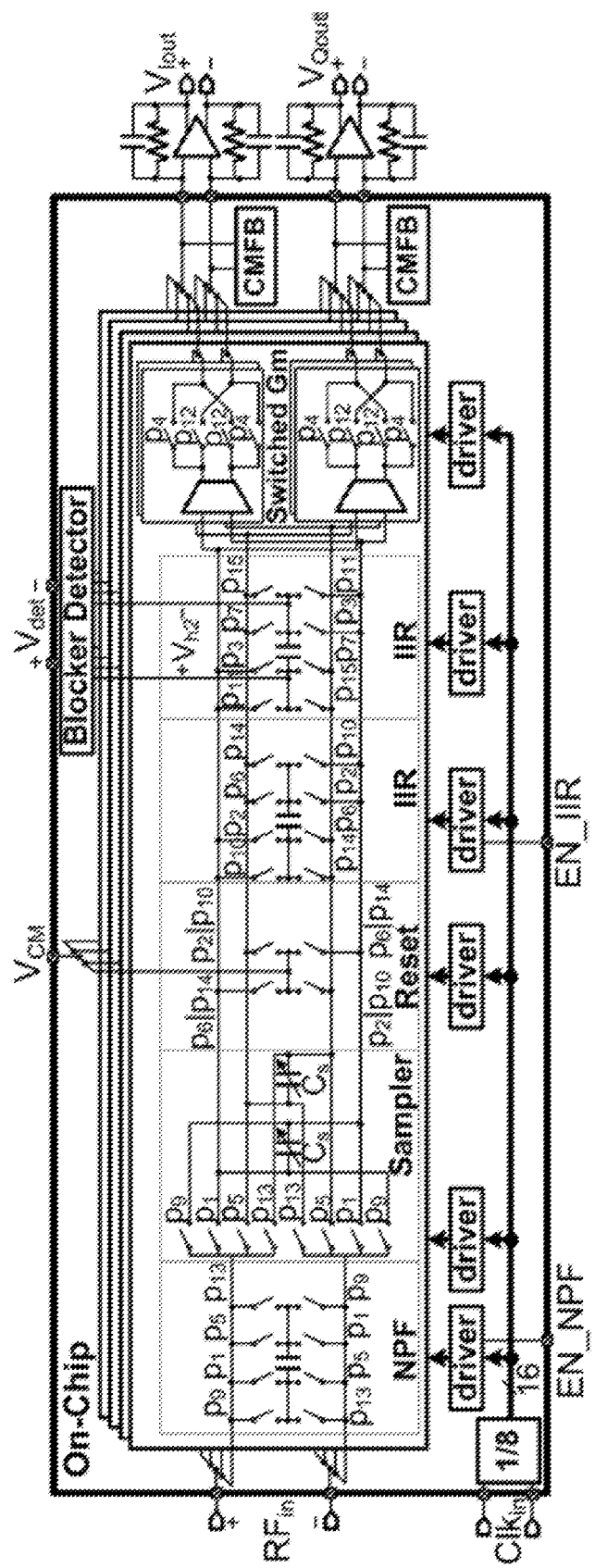
FIG. 25 is a schematic diagram of an example of a chopping SC receiver front-end with merged choppers in accordance with some embodiments.

An example of a more detailed schematic for the implementation in FIG. 24 is illustrated in FIG. 25 in accordance with some embodiments. As shown, Cs capacitor pairs with sampling phase $p_i$ and $p_{i+4}$ share the same $C_h$s in the N-path filters and the IIR filters to eliminate the DC and even-order LO harmonic responses.

Figure 19:
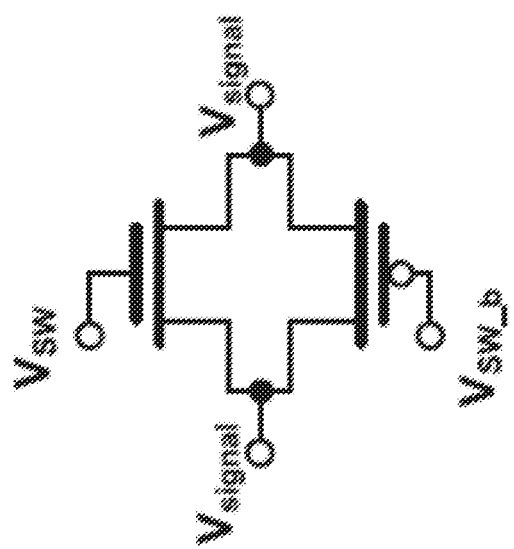
FIG. 19 is a block diagram of example of a CMOS switch in accordance with some embodiments.

In some embodiments, the switches can be implemented with CMOS transmission gates, as illustrated in FIG. 19.

Figure 27:
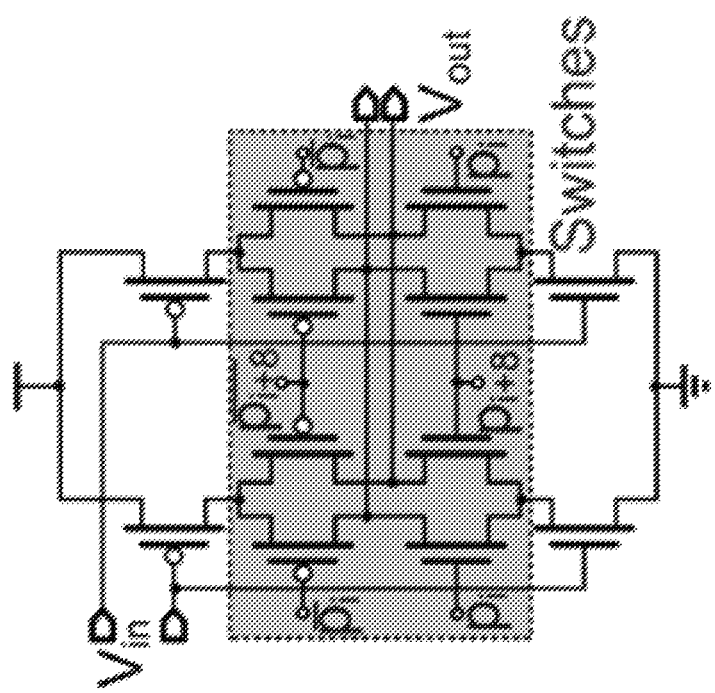
FIG. 27 is a block diagram of an example of a Gm cell in accordance with some embodiments.

The Gm cells with output switches act as switched Gm cells and the DC current of the Gm cells can be cut off when the switches are OFF to save power. As example of a Gm cell in accordance with some embodiments is shown in FIG. 27.

The on-chip LO divider can be used to generate the 16-phase non-overlapping clock signals.

Figure 26:
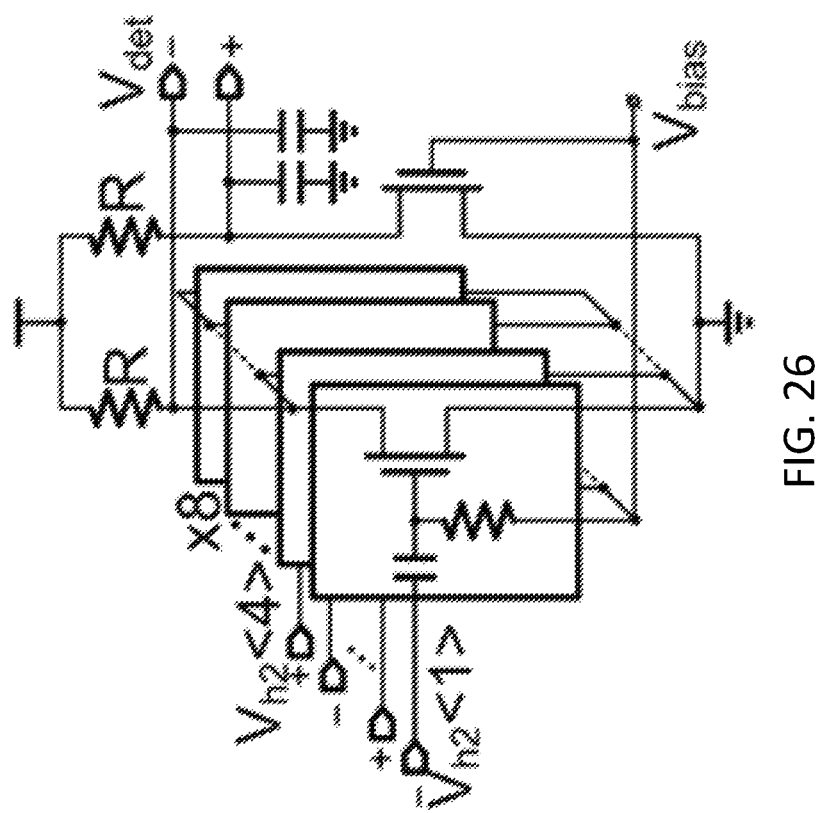
FIG. 26 is a block diagram of an example of a blocker envelope detector in accordance with some embodiments.

An example of a blocker envelope detector in accordance with some embodiments is shown in FIG. 26. The blocker envelope detector includes eight AC coupled common-source transistors operating in weak inversion with resistor and off-chip capacitor loads and a replica.

Figure 29:
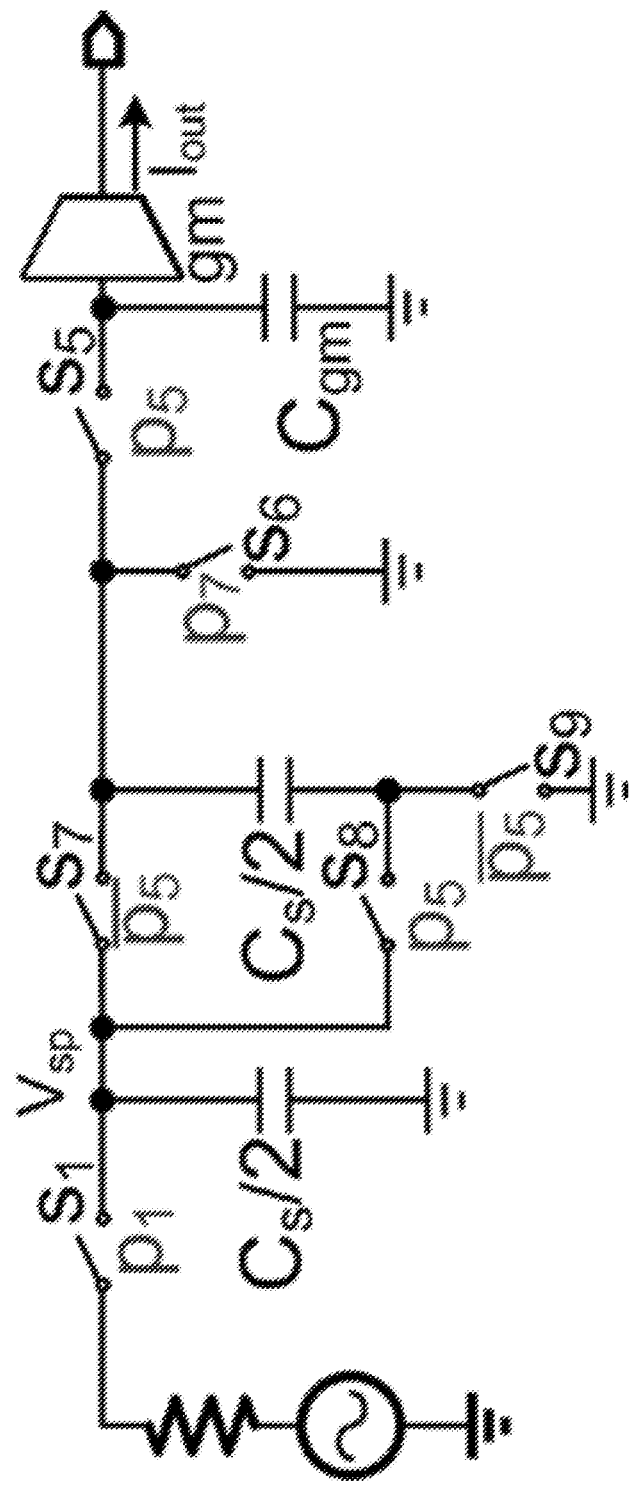
FIG. 29 is a block diagram of an example of a SC RF receiver front-end using stacked sampling capacitors in accordance with some embodiments.

In accordance with some embodiments, a SC RF front-end can be implemented with capacitor stacking. An example of a schematic of a Bank #1 of such a front-end in accordance with some embodiments is illustrated in FIG. 29. As shown, capacitor $C_S$ is divided into two capacitors, each labelled $C_s/2$ and having half of the capacitance of $C_s$. MoM and MiM capacitors can be used in some embodiments. Switches $s_7$-$s_9$ are added for capacitor stacking. $s_8$ is driven by clock signal $p_5$, while $s_7$ and $s_9$ are driven by inverted $p_5$ clock.

Figure 30:
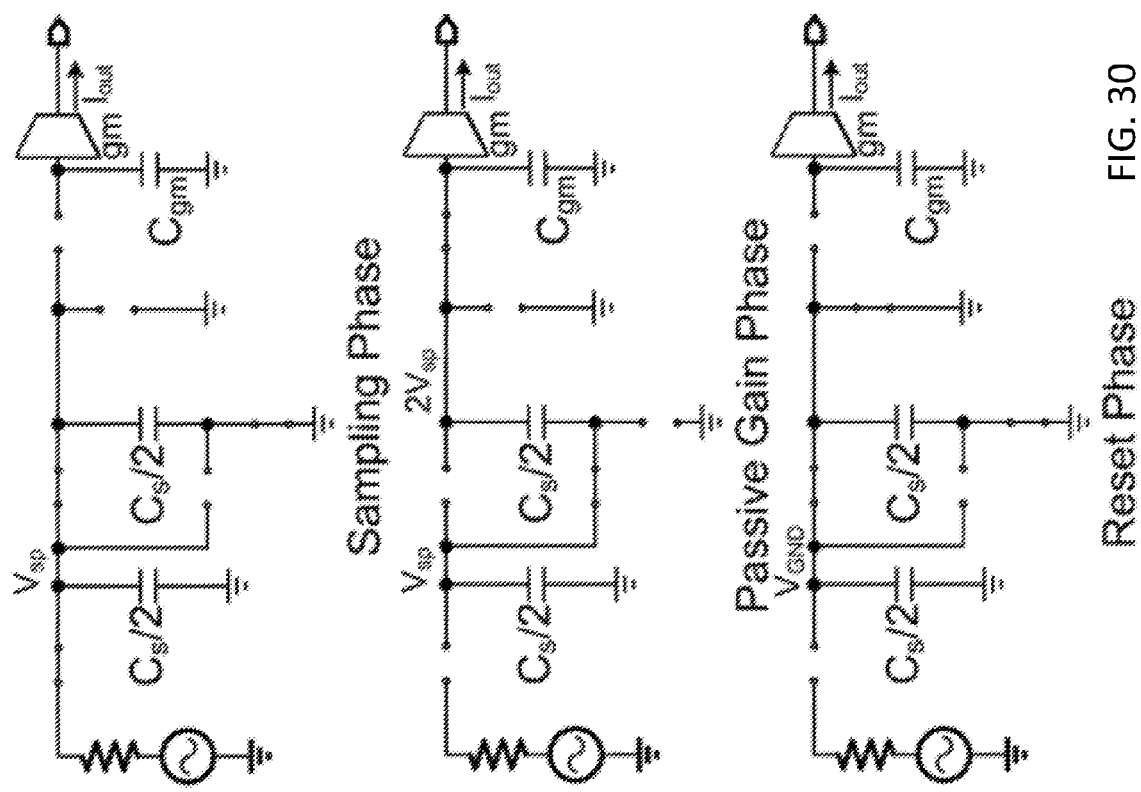
FIG. 30 is an illustration of the operation of a SC RF receiver front-end using stacked sampling capacitors in accordance with some embodiments.

FIG. 30 shows an example of the operation of a capacitor stacking SC RF front-end in accordance with some embodiments. As shown, in sampling phase ($p_1$), the RF signal is sampled on two the sampling capacitors $C_s/2$. The sampled voltage is $V_{sp}$. In the passive gain phase ($p_5$), the two capacitors are stacked up, the signal is doubled; the voltage propagated to the Gm input node is $2V_{sp}$. The passive gain reduces the noise contribution of the following stages. In the reset phase ($p_7$), the sampling capacitor voltage is reset to the ground voltage.

Figure 31:
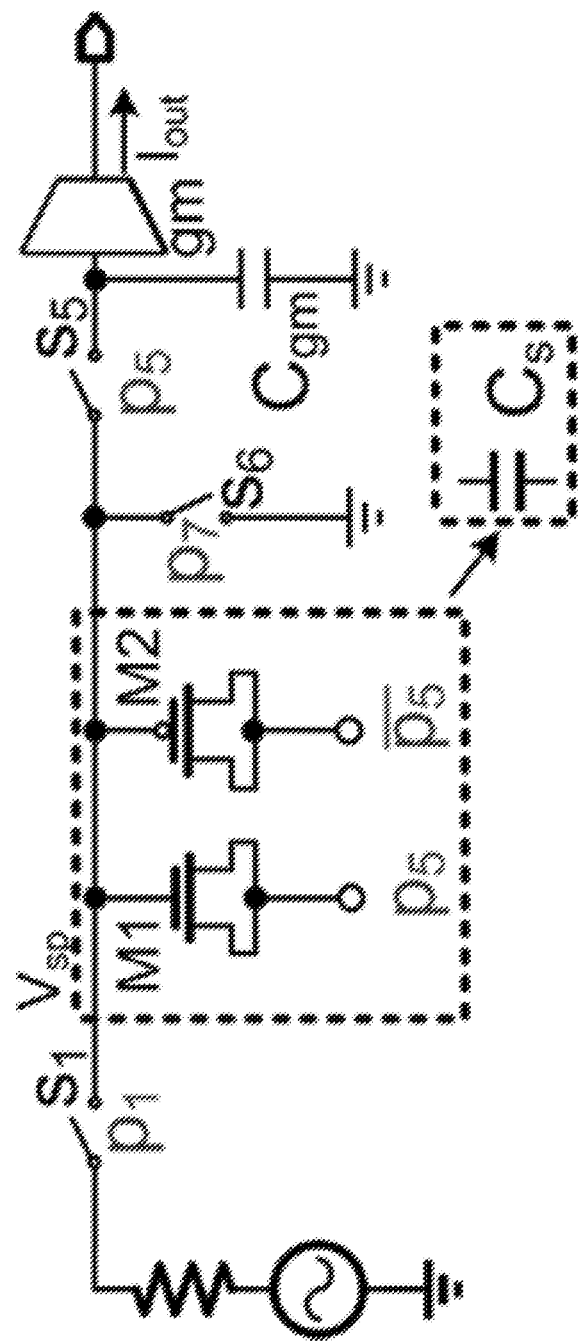
FIG. 31 is a block diagram of an example of a SC RF receiver front-end using transistors as sampling capacitors in accordance with some embodiments.

In some embodiments, NMOS and PMOS transistors can be used as sampling capacitor Cs as shown in FIG. 31. The capacitance of these MOS capacitors is changed with source voltage to achieve a parametric amplification. Both NMOS and PMOS are used to make sure the common mode voltage does not change when changing source voltage. The source node of NMOS M1 is connected to clock signal $p_5$, and the source node of PMOS M2 is connected to inverted clock signal $p_5$. The source and the drain of the MOS transistors are shorted.

Figure 32:
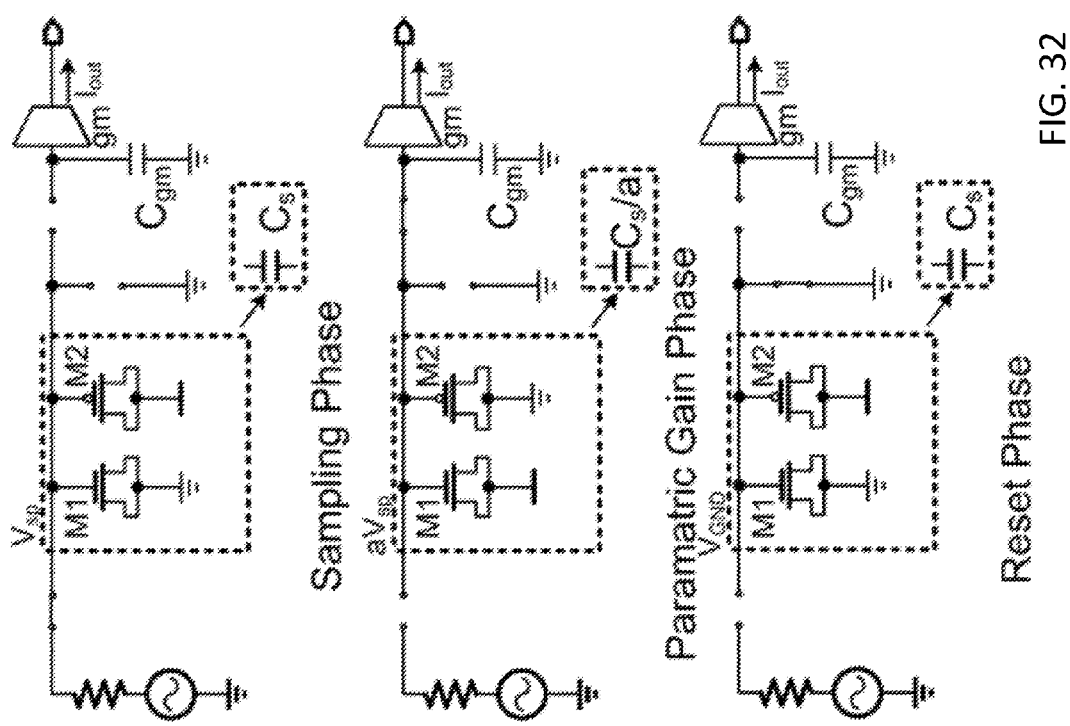
FIG. 32 is an illustration of the operation of a SC RF receiver front-end using transistors as sampling capacitors in accordance with some embodiments.

An example of the operation of the front-end illustrated in FIG. 32 is now described in connection with FIG. 31 in accordance with some embodiments. In the sampling phase ($p_1$), the source voltage of M1 is $V_{GND}$, while the source voltage of M2 is $V_{DD}$. Both of the two MOS transistors are in inversion mode. The capacitance is $C_s$. The RF signal is sampled on the MOS capacitor; the sampled voltage is $V_{sp}$. In parametric gain phase ($p_5$), the source voltages of M1 and M2 are switched to $V_{DD}$ and $V_{GND}$ respectively. The MOS transistors are working in depletion mode in which the capacitance is smaller than inversion mode, which is $C_s/a$ (a>0). Since the charge on the sampling capacitor should be a constant, the voltage propagated to Gm input is $a \cdot V_{sp}$.

Figure 33:
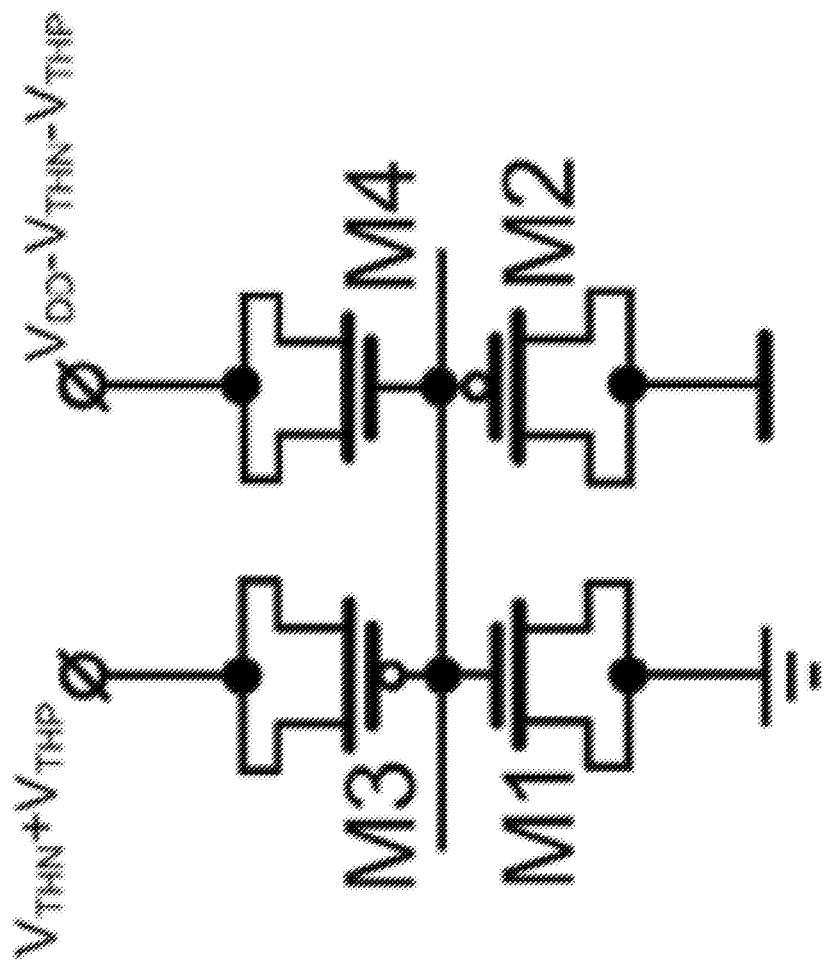
FIG. 33 is a block diagram of PMOS and NMOS capacitors in parallel in accordance with some embodiments.

In some embodiments, to compensate for non-linear behavior in the transistor capacitors of FIG. 31, complementary transistor capacitors can be put in parallel with the transistor capacitors of FIG. 31, as shown in FIG. 33. For example, a PMOS M3 can be put in parallel with M1 and the source voltage in sampling, filtering, and reset phases can be set to $V_{THN}+V_{THP}$ to compensate non-linear behavior of M1, where $V_{THN}$ and $V_{THP}$ are the threshold voltages of the NMOS and PMOS transistors. Likewise, NMOS M4 can be put in parallel with M2 to compensate the non-linear behavior of M2 and the source voltage can be set to $V_{DD}-V_{THN}-V_{THP}$. The source nodes of the NMOS transistor capacitors (M1 and M4) can be connected to $V_{DD}$ and source nodes of PMOS transistor capacitors (M2 and M3) can be connected to $V_{GND}$ in parametric gain phase.

The provision of the examples described herein (as well as clauses phrased as "such as," "e.g.," "including," and the like) should not be interpreted as limiting the claimed subject matter to the specific examples; rather, the examples are intended to illustrate only some of many possible aspects. It should also be noted that, as used herein, the term mechanism can encompass hardware, software, firmware, or any suitable combination thereof.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims which follow. Features of the disclosed embodiments can be combined and rearranged in various ways.

What is claimed is:

1. A circuit for a switched capacitor radio frequency (RF) receiver front-end, comprising:
    a plurality of banks, each comprising:
        a first switch having a first side connected to a RF input signal and a second side;
        a sampling capacitor having a first side connected to the second side of the first switch and a second side connected to ground;
        a second switch having a first side connected to the first side of the sampling capacitor and a second side connected to the second side of the sampling capacitor; and
        a Gm cell having a first input coupled to the first side of the sampling capacitor and an output;

wherein:
the output of the Gm cell of each of the plurality on banks are coupled together; and
the first switch and the second switch are controlled by a multi-phase signal that causes, for each of the plurality of banks, the first switch to be turned ON at a first point in time and the second switch to be turned ON at a second point in time, wherein the first point in time for a first of the plurality of banks is not the same as the first point in time for a second of the plurality of banks.

2. The circuit of claim 1, wherein:
the first input of the Gm cell is coupled to the first side of the sampling capacitor by a third switch;
the third switch is controlled by the multi-phase signal; and
the third switch is turned ON at a third point in time.

3. The circuit of claim 1, wherein:
the first input of the Gm cell is coupled to the first side of the sampling capacitor by a connection;
each of the plurality of banks further comprises a fourth switch at the output of the Gm cell that couples the output of the Gm cell to the output of the Gm cell of other bank(s) of the plurality of banks;
the fourth switch is controlled by the multi-phase signal; and
the fourth switch is turned ON at a fourth point in time.

4. The circuit of claim 1, wherein:
each of the plurality of banks further comprises:
a fifth switch having a first side connected to the RF input signal and a second side; and
a second capacitor having a first side connected to the second side of the fifth switch and a second side connected to the ground;
the fifth switch is controlled by the multi-phase signal; and
the fifth switch is turned ON at a fifth point in time.

5. The circuit of claim 1, wherein:
each of the plurality of banks further comprises:
a sixth switch having a first side connected to the second side of the first switch and a second side; and
a third capacitor having a first side connected to the second side of the sixth switch and a second side connected to the ground;
the sixth switch is controlled by the multi-phase signal; and
the sixth switch is turned ON at a sixth point in time.

6. The circuit of claim 5, wherein:
each of the plurality of banks further comprises:
a seventh switch having a first side connected to the second side of the first switch and a second side; and
a fourth capacitor having a first side connected to the second side of the seventh switch and a second side connected to the ground;
the seventh switch is controlled by the multi-phase signal; and
the seventh switch is turned ON at a seventh point in time.

7. The circuit of claim 6, wherein:
each of the plurality of banks further comprises:
an eighth switch having a first side connected to the second side of the first switch and a second side; and
a fifth capacitor having a first side connected to the second side of the eighth switch and a second side connected to the ground;
the eighth switch is controlled by the multi-phase signal; and
the eighth switch is turned ON at an eighth point in time.

8. The circuit of claim 1, further comprising a transimpedance amplifier having an input coupled to the output of the Gm cell.

9. The circuit of claim 1, wherein each of the plurality of banks further comprises sixth capacitor that is in parallel with the sampling capacitor during a sampling phase of the multi-phase signal and in series with the sampling capacitor during at least one other phase of the multi-phase signal.

10. The circuit of claim 1, wherein the sampling capacitor is implemented using a PMOS transistor.

11. The circuit of claim 1, wherein the sampling capacitor is implemented using an NMOS transistor.

* * * * *